(12) United States Patent
Kadono et al.

(10) Patent No.: US 10,679,850 B2
(45) Date of Patent: Jun. 9, 2020

(54) MANUFACTURING METHOD FOR FORMING A THIN FILM BETWEEN TWO TERMINALS

(71) Applicant: Sony Corporation, Tokyo (JP)

(72) Inventors: Koji Kadono, Kanagawa (JP); Shinji Imaizumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/303,689

(22) PCT Filed: May 17, 2017

(86) PCT No.: PCT/JP2017/018560
§ 371 (c)(1),
(2) Date: Nov. 21, 2018

(87) PCT Pub. No.: WO2017/208826
PCT Pub. Date: Dec. 7, 2017

(65) Prior Publication Data
US 2019/0252182 A1    Aug. 15, 2019

(30) Foreign Application Priority Data

May 30, 2016   (JP) ................................ 2016-107173

(51) Int. Cl.
*C01B 21/064*   (2006.01)
*C01G 39/06*   (2006.01)
(Continued)

(52) U.S. Cl.
CPC ........ *H01L 21/0262* (2013.01); *C01B 21/064* (2013.01); *C01G 39/06* (2013.01);
(Continued)

(58) Field of Classification Search
CPC .......... H01L 21/0262; H01L 21/02425; H01L 21/02444; H01L 21/02527; H01L 21/0254;
(Continued)

(56) References Cited

U.S. PATENT DOCUMENTS 4,543,275 A    9/1985   Akashi et al.
9,362,524 B2 *  6/2016   Mori ........................ B05D 1/60
(Continued)

FOREIGN PATENT DOCUMENTS

JP    57-134558 A    8/1982
JP    11-071665 A    3/1999
(Continued)

OTHER PUBLICATIONS

International Search Report and English translation thereof dated Jul. 11, 2017 in connection with International Application No. PCT/JP2017/018560.

(Continued)

*Primary Examiner* — Ly D Pham
(74) *Attorney, Agent, or Firm* — Wolf, Greenfield & Sacks, P.C.

(57) ABSTRACT

A thin-film manufacturing method, a thin-film manufacturing apparatus, a manufacturing method for a photoelectric conversion element, a manufacturing method for a logic circuit, a manufacturing method for a light-emitting element, and a manufacturing method for a light control element with which number-of-layers control and laminating and film-forming of different kinds of materials is described. A thin-film manufacturing method according to the present technology includes bringing an electrically conductive film-forming target into contact with a first terminal and a second terminal, heating a first region that is a region of the film-forming target between the first terminal and the second (Continued)

terminal by applying voltage between the first terminal and the second terminal, supplying a film-forming raw material to the first region; and forming a thin film in the first region by controlling reaction time such that a thin film having a desired number of layers is formed.

17 Claims, 8 Drawing Sheets

(51) Int. Cl.

| | |
|---|---|
| *C23C 16/46* | (2006.01) |
| *C23C 16/52* | (2006.01) |
| *C23C 16/54* | (2006.01) |
| *H01L 21/02* | (2006.01) |
| *H01L 31/18* | (2006.01) |
| *H01L 33/00* | (2010.01) |
| *H01L 33/42* | (2010.01) |
| *H01L 21/285* | (2006.01) |
| *C23C 14/56* | (2006.01) |

(52) U.S. Cl.
CPC ............. *C23C 14/56* (2013.01); *C23C 16/46* (2013.01); *C23C 16/52* (2013.01); *C23C 16/54* (2013.01); *H01L 21/0254* (2013.01); *H01L 21/02425* (2013.01); *H01L 21/02444* (2013.01); *H01L 21/02527* (2013.01); *H01L 21/02568* (2013.01); *H01L 21/285* (2013.01); *H01L 31/18* (2013.01); *H01L 31/1804* (2013.01); *H01L 31/1856* (2013.01); *H01L 31/1884* (2013.01); *H01L 33/007* (2013.01); *H01L 33/0054* (2013.01); *H01L 33/42* (2013.01); *C01P 2006/40* (2013.01); *H01L 2933/0016* (2013.01)

(58) Field of Classification Search
CPC . H01L 21/02568; H01L 21/285; H01L 31/18; H01L 31/1804; H01L 31/1856; H01L 31/1884; H01L 33/0054; H01L 33/007; H01L 33/42; H01L 2933/0016; C01B 21/064; C01G 39/06; C01P 2006/40; C23C 14/56; C23C 16/46; C23C 16/52; C23C 16/54
USPC .......................................................... 438/22
See application file for complete search history.

(56) References Cited

U.S. PATENT DOCUMENTS

| | | | | |
|---|---|---|---|---|
| 2002/0046943 | A1 | 4/2002 | Echizen et al. | |
| 2005/0095740 | A1* | 5/2005 | Hirakata | G09G 3/3208 438/29 |
| 2009/0252893 | A1* | 10/2009 | Ozaki | C23C 16/45595 427/579 |
| 2011/0250709 | A1* | 10/2011 | Tachibana | H01L 31/208 438/17 |
| 2012/0325319 | A1* | 12/2012 | Nishimura | H01L 51/0037 136/263 |
| 2014/0102532 | A1* | 4/2014 | Nishimoto | H01L 31/0201 136/256 |
| 2014/0124034 | A1* | 5/2014 | Nishimoto | H01L 31/0201 136/259 |

FOREIGN PATENT DOCUMENTS

| | | |
|---|---|---|
| JP | 11-140204 A | 5/1999 |
| JP | 2002-129321 A | 5/2002 |
| JP | 2011-174097 A | 9/2011 |
| JP | 2012-144783 A | 8/2012 |
| JP | 2013-014484 A | 1/2013 |

OTHER PUBLICATIONS

Written Opinion and English translation thereof dated Jul. 11, 2017 in connection with International Application No. PCT/JP2017/018560.

International Preliminary Report on Patentability and English translation thereof dated Dec. 13, 2018 in connection with International Application No. PCT/JP2017/018560.

* cited by examiner

MANUFACTURING METHOD FOR FORMING A THIN FILM BETWEEN TWO TERMINALS

CROSS REFERENCE TO RELATED APPLICATIONS

This is a U.S. National Stage Application under 35 U.S.C. § 371, based on International Application No. PCT/JP2017/018560, filed May 17, 2017, which claims priority to Japanese Patent Application JP 2016-107173, filed May 30, 2016, each of which is hereby incorporated by reference in its entirety.

TECHNICAL FIELD

The present technology relates to a thin-film manufacturing method, a thin-film manufacturing apparatus, a manufacturing method for a photoelectric conversion element, a manufacturing method for a logic circuit, a manufacturing method for a light-emitting element, and a manufacturing method for a light control element for manufacturing a thin film that can be utilized for a semiconductor device or an optical device.

BACKGROUND ART

More and more thin films have been utilized in semiconductor devices and optical devices. Conventionally, there has been often used a batch-type film-forming method in which a film-forming raw material (e.g., a precursor of reaction product) is supplied to a base material while the base material is heated with an electric furnace or the like and the film-forming material is thus precipitated in the base material surface (see: G. A. Matthew, Proquest LLC, A Layered Chalcogenide Phase Change Memory Device 2008).

Further, there has also been developed a film-forming method in which film-forming is performed by applying current on a base material and supplying a film-forming raw material to a base material surface while heating the base material by resistance heating. For example, Patent Literature 1 has disclosed a graphene production method in which a thin film made of graphene is formed on a surface that is a film-forming target by supplying a carbon source substance to the film-forming target heated by resistance heating.

CITATION LIST

Patent Literature

Patent Literature 1: Japanese Patent Application Laid-open No. 2013-14484

DISCLOSURE OF INVENTION

Technical Problem

However, with the batch-type film-forming method, many film-forming materials exhibit low environment stability at high temperature, and become thin films easy to peel off in some atmospheres and retention states inside the furnace. Further, for controlling the physical properties of the element, it is extremely important to appropriately obtain a desired number of thin film layers when forming an element including a thin film. However, an environment inside a furnace such as an electric furnace is high temperature for long time, and thus the reaction time is long. Thus, in particular, it has been difficult to control the number of layers of a thin film with layers of atoms that are 1 to 100 layers for forming the thin film (see: ACS Nano, 2010, 4(5), 2695 DOI: 10.1021/nn1003937).

Further, with the film-forming method described in Patent Literature 1, a monolayer graphene production method is described while other film-forming materials, number-of-layers control, and laminating and film-forming of different kinds of materials are not described.

In view of the above-mentioned circumstances, it is an object of the present technology to provide a thin-film manufacturing method, a thin-film manufacturing apparatus, a manufacturing method for a photoelectric conversion element, a manufacturing method for a logic circuit, a manufacturing method for a light-emitting element, and a manufacturing method for a light control element with which number-of-layers control and laminating and film-forming of different kinds of materials can be performed.

Solution to Problem

In order to accomplish the above-mentioned object, a thin-film manufacturing method according to an embodiment of the present technology includes:

bringing an electrically conductive film-forming target into contact with a first terminal and a second terminal;

heating a first region that is a region of the film-forming target between the first terminal and the second terminal by applying voltage between the first terminal and the second terminal;

supplying a film-forming raw material to the first region; and forming a thin film in the first region by controlling reaction time such that a thin film having a desired number of layers is formed.

In accordance with this manufacturing method, by applying voltage on the first terminal and the second terminal and causing current to flow between the first terminal and the second terminal via the film-forming target, heating (electrical heating) is caused in the film-forming target due to electrical resistance. The electrically heating makes it possible to perform rapid heating and rapid cooling in comparison with other heating methods, and can highly accurately control the reaction time (time for which film-forming progresses). Here, with some film-forming materials, several tens of layers are formed per second, and although it is difficult to control the number of layers with a general heating method, with the electrical heating, the reaction time can be highly accurately controlled and heating can be stopped at a point of time at which an arbitrary number of layers is formed. That is, in accordance with this manufacturing method, a thin film having a controlled number of layers can be manufactured.

The thin film may be a laminated film in which different kinds of materials are laminated.

In the above-mentioned manufacturing method, a laminated film in which different kinds of materials are laminated can also be manufactured by changing the film-forming raw material to be supplied to the first region.

The above-mentioned thin-film manufacturing method may further include applying voltage between the first terminal and the second terminal and controlling the reaction time by using movement speed of the film-forming target while moving the film-forming target with respect to the first terminal and the second terminal.

In accordance with this manufacturing method, time for which a point on the film-forming target passes the first region can be controlled by using the movement speed of the film-forming target, and time for which that point is heated, that is, the reaction time can be controlled.

The above-mentioned thin-film manufacturing method may further include conveying the film-forming target by a roll-to-roll process and moving the film-forming target with respect to the first terminal and the second terminal.

By conveying the film-forming target by the roll-to-roll process, a film can be formed on a film-forming target having a large area, and the thin film can be mass-produced.

The above-mentioned manufacturing method may further include controlling the reaction time by using application time of voltage on the first terminal and the second terminal.

As described above, rapid heating and rapid cooling can be performed by applying voltage and stopping voltage application in the electrical heating, and the reaction time can be highly accurately controlled by using the application time of voltage.

The above-mentioned manufacturing method may further include:

stopping voltage application between the first terminal and the second terminal;

cooling the first region; and controlling the reaction time such that a thin film having a desired number of layers is formed.

By stopping voltage application between the first terminal and the second terminal, the number of layers of the thin film can be controlled.

The above-mentioned manufacturing method may further include:

further bringing the film-forming target into contact with a third terminal and a fourth terminal;

heating a second region that is a region of the film-forming target between the third terminal and the fourth terminal by applying voltage between the third terminal and the fourth terminal;

vaporizing, in the second region, a film-forming raw material made to adhere to the film-forming target; and supplying the vaporized film-forming raw material to the first region.

In accordance with this manufacturing method, the supply of the film-forming raw material to the first region in which film-forming progresses can be performed by electrical heating in the second region, and an amount of film-forming raw material suitable for film-forming can be vaporized in the second region and supplied to the first region.

The above-mentioned thin-film manufacturing method may further include further bringing the film-forming target into contact with a fifth terminal and a sixth terminal;

heating a third region that is a region of the film-forming target between the fifth terminal and the sixth terminal by applying voltage between the fifth terminal and the sixth terminal;

supplying a film-forming raw material to the third region; and laminating a thin film in the third region by controlling reaction time.

In accordance with this manufacturing method, film-forming is performed by electrical heating both in the first region and the third region, and thus a laminated film in which different kinds of materials are laminated and the number of layers of each material is controlled can be manufactured.

The above-mentioned thin-film manufacturing method may further include further bringing the film-forming target into contact with a seventh terminal and an eighth terminal;

heating a fourth region that is a region of the film-forming target between the seventh terminal and the eighth terminal by applying voltage between the seventh terminal and the eighth terminal;

vaporizing, in the fourth region, a film-forming raw material made to adhere to the film-forming target; and supplying the vaporized film-forming raw material to the third region.

In accordance with this manufacturing method, the supply of the film-forming raw material to the third region can also be performed by electrical heating in the fourth region, and an amount of film-forming raw material suitable for film-forming can be vaporized in the fourth region and supplied to the third region.

The reaction time may be 10 minutes or less.

In the above-mentioned thin-film manufacturing method, the film-forming target may be moved at such speed that the reaction time becomes 10 minutes or less.

In the above-mentioned thin-film manufacturing method, the film-forming target may be moved at a speed of 10 m per minute or less.

In the above-mentioned thin-film manufacturing method, the first region may be heated at a temperature of 300 K or more.

In order to accomplish the above-mentioned object, a thin-film manufacturing apparatus according to an embodiment of the present technology includes a first terminal, a second terminal, a first power supply, a third terminal, a fourth terminal, and a conveying mechanism.

The first power supply applies voltage between the first terminal and the second terminal.

The second power supply applies voltage between the third terminal and the fourth terminal.

The conveying mechanism conveys a film-forming target while bringing the film-forming target into contact with the first terminal, the second terminal, the third terminal, and the fourth terminal.

The first terminal, the second terminal, the third terminal, and the fourth terminal are provided such that a first region that is a region of the film-forming target between the first terminal and the second terminal is opposed to a second region that is a region of the film-forming target between the third terminal and the fourth terminal.

In accordance with this configuration, by making the film-forming raw material adhere to the film-forming target, the film-forming raw material can be vaporized from the second region heated due to electrical heating and can be supplied to the first region. Thus, film-forming can be performed in the first region.

The above-mentioned thin-film manufacturing apparatus may further include a fifth terminal, a sixth terminal, a third power supply, a seventh terminal, an eighth terminal, and a fourth power supply.

The third power supply applies voltage between the fifth terminal and the sixth terminal.

The fourth power supply applies voltage between the seventh terminal and the eighth terminal.

The conveying mechanism conveys the film-forming target while bringing the film-forming target into contact with the first terminal, the second terminal, the third terminal, the fourth terminal, the fifth terminal, the sixth terminal, the seventh terminal, and the eighth terminal.

The fifth terminal, the sixth terminal, the seventh terminal, and the eighth terminal are provided such that a third region that is a region of the film-forming target between the fifth terminal and the sixth terminal is opposed to a fourth region that is a region of the film-forming target between the seventh terminal and the eighth terminal.

In accordance with this configuration, by making the film-forming raw material adhere to the film-forming target after the thin film is formed in the first region, the film-forming raw material can be vaporized from the fourth region heated due to electrical heating and can be supplied to the third region. Thus, film-forming can be performed in the third region.

The above-mentioned thin-film manufacturing apparatus may further include a chamber.

The chamber houses the first terminal, the second terminal, the third terminal, the fourth terminal, the fifth terminal, the sixth terminal, the seventh terminal, and the eighth terminal.

In accordance with this configuration, film-forming in the first region and film-forming in the third region are continuously performed inside a single chamber, and thus it is possible to prevent impurities from entering the thin film.

In order to accomplish the above-mentioned object, a manufacturing method for a photoelectric conversion element according to an embodiment of the present technology having a thin film and including a photoelectric conversion film, a transparent electrode layer, and a charge storage circuit, includes, as a step of manufacturing the thin film, steps of:

bringing an electrically conductive film-forming target into contact with a first terminal and a second terminal;

heating a first region that is a region of the film-forming target between the first terminal and the second terminal by applying voltage between the first terminal and the second terminal;

supplying a film-forming raw material to the first region; and forming a thin film in the first region by controlling reaction time such that a thin film having a desired number of layers is formed.

In order to accomplish the above-mentioned object, a manufacturing method for a logic circuit according to an embodiment of the present technology having a thin film and including a transistor and a wiring electrode, includes, as a step of manufacturing the thin film, steps of:

bringing an electrically conductive film-forming target into contact with a first terminal and a second terminal;

heating a first region that is a region of the film-forming target between the first terminal and the second terminal by applying voltage between the first terminal and the second terminal; and supplying a film-forming raw material to the first region; and forming a thin film in the first region by controlling reaction time such that a thin film having a desired number of layers is formed.

In order to accomplish the above-mentioned object, a manufacturing method for a light-emitting element according to an embodiment of the present technology having a thin film and including a light-emitting layer, a buffer layer, a transparent electrode layer, and a thin-film transistor, includes, as a step of manufacturing the thin film, steps of:

bringing an electrically conductive film-forming target into contact with a first terminal and a second terminal;

heating a first region that is a region of the film-forming target between the first terminal and the second terminal by applying voltage between the first terminal and the second terminal;

supplying a film-forming raw material to the first region; and forming a thin film in the first region by controlling reaction time such that a thin film having a desired number of layers is formed.

In order to accomplish the above-mentioned object, a manufacturing method for a light control element according to an embodiment of the present technology having a thin film and including a light control layer and a transparent electrode layer, includes, as a step of manufacturing the thin film, steps of:

bringing an electrically conductive film-forming target into contact with a first terminal and a second terminal;

heating a first region that is a region of the film-forming target between the first terminal and the second terminal by applying voltage between the first terminal and the second terminal;

supplying a film-forming raw material to the first region; and forming a thin film in the first region by controlling reaction time such that a thin film having a desired number of layers is formed.

Advantageous Effects of Invention

As described above, in accordance with the present technology, it is possible to provide a thin-film manufacturing method, a thin-film manufacturing apparatus, a manufacturing method for a photoelectric conversion element, a manufacturing method for a logic circuit, a manufacturing method for a light-emitting element, and a manufacturing method for a light control element with which number-of-layers control and laminating and film-forming of different kinds of materials can be performed. It should be noted that the effects described here are not necessarily limitative and any effect described in the present disclosure may be provided.

MODE(S) FOR CARRYING OUT THE INVENTION

First Embodiment

A first embodiment of the present technology will be described.

[Regarding Configuration of Thin-Film Manufacturing Apparatus]

Figure 1:
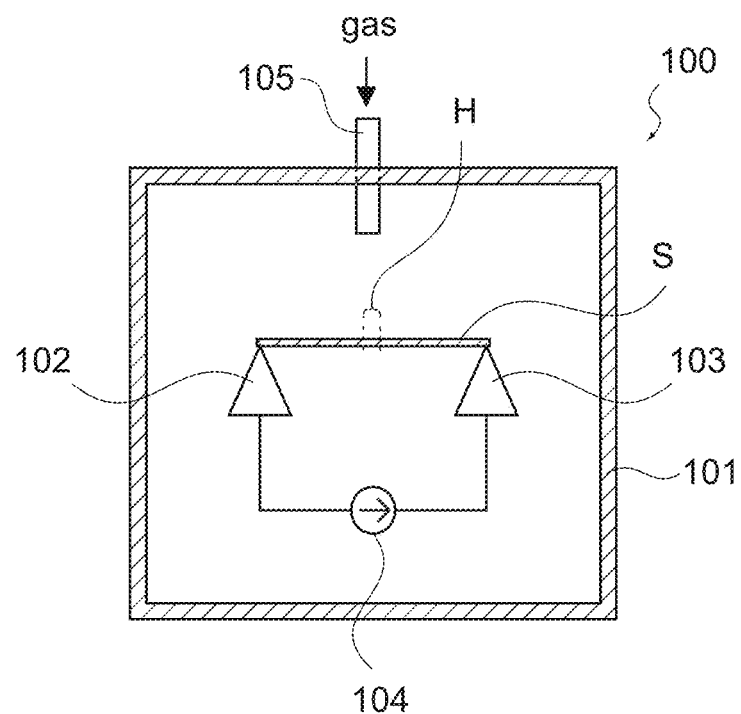
FIG. 1 A schematic view showing a thin-film manufacturing apparatus according to a first embodiment of the present technology.

FIG. 1 is a schematic view of a thin-film manufacturing apparatus 100 according to this embodiment.

As shown in the figure, the thin-film manufacturing apparatus 100 includes a chamber 101, a first terminal 102, a second terminal 103, a power supply 104, and a gas supply section 105. A film-forming target S is set on the first terminal 102 and the second terminal 103.

The first terminal 102 and the second terminal 103 are housed in the chamber 101 and are each connected to the power supply 104. The gas supply section 105 is connected to the chamber 101.

The chamber 101 maintains the inside at a predetermined pressure. A gas discharge mechanism such as a vacuum pump may be connected to the chamber 101. The chamber 101 can be a vacuum chamber. The chamber 101 may be a chamber having strength lower than that of the vacuum chamber and only needs to be capable of maintaining a degree of vacuum (or a positive pressure) necessary for a film-forming process. It should be noted that the chamber 101 does not need to have high thermal resistance, and thus a chamber which is not thermally resistive can be used.

The first terminal 102 and the second terminal 103 are arranged to be spaced apart from each other in the chamber 101 and are each brought into contact with the film-forming target S. The first terminal 102 and the second terminal 103 are for causing current supplied from the power supply 104 to flow into the film-forming target S and are also for supporting the film-forming target S.

By those first terminal 102 and second terminal 103, the film-forming target S is supported in the chamber 101. Here, the thin-film manufacturing apparatus 100 is not limited to the thin-film manufacturing apparatus 100 in which the film-forming target S is supported by the first terminal 102 and the second terminal 103, and may be a thin-film manufacturing apparatus 100 in which the film-forming target S is supported by a supporting member. It is favorable that the supporting member is made of a material having a low thermal conductivity and high thermal resistance and excellent in insulation, for example, quartz or the like.

The power supply 104 applies voltage between the first terminal 102 and the second terminal 103. The power supply 104 may be a direct-current power supply or may be an alternating-current power supply. The power supply 104 may be arranged inside the chamber 101 or may be arranged outside the chamber 101.

The gas supply section 105 introduces gas of a film-forming raw material (hereinafter, raw material gas) into the chamber 101. The film-forming raw material is a reactive precursor or the like and only needs to react on the film-forming target S and form a thin film. By limiting the supply of the raw material gas introduced from the gas supply section 105, it is possible to control the reaction space in which film-forming is performed. The raw material gas can be one or more kinds of gases. The thin-film manufacturing apparatus 100 may include a plurality of gas supply sections 105.

Further, the film-forming raw material is not limited to the gas, and may be a substance in the solid state or the liquid state under ordinary temperature and normal pressure. The film-forming raw material may be, for example, in the solid state or the liquid state, housed in the chamber 101 and be vaporized (sublimated or evaporated) by heating or the like by a vacuum or heating means inside the chamber 101. That is, the film-forming raw material only needs to be a substance that can be, in the gas state, supplied to the film-forming target S.

The thin-film manufacturing apparatus 100 can have the above-mentioned configuration. In the thin-film manufacturing apparatus 100, the film-forming target S is heated by resistance heating, and a portion other than the film-forming target S does not reach excessively high temperature. Therefore, the thin-film manufacturing apparatus 100 can be made of a material selected irrespective of the thermal resistance.

[Regarding Film-Forming Target]

The thin film manufactured in this embodiment is generated by being formed on the film-forming target S. The film-forming target S can be electrically conductive and flexible. As will be described later, in the present technology, current is applied on the film-forming target S to thereby heat (perform resistance heating on) the film-forming target S, and thus, the film-forming target S needs to be conductive.

Further, the film-forming target S can be flexible (soft). By using the flexible film-forming target S, it becomes easy to handle it, and it is suitable to manufacture the thin film. In particular, the roll-to-roll process to be described later can be applied by using the flexible film-forming target S, and thus it is favorable.

The film-forming target S can be metal foil typically made of metal such as iron and copper. Further, the film-forming target S may be wires, mesh, or the like made of metal. Otherwise, the film-forming target S may be obtained by laminating an electrically conductive substance such as graphene on metal in advance or may be obtained by laminating an electrically conductive material on a base material made of an insulative material. That is, the film-forming target S only needs to be capable of being subjected to resistance heating by applying voltage between the first terminal 102 and the second terminal 103.

[Regarding Thin-Film Manufacturing Method]

A manufacturing method for a thin film utilizing the thin-film manufacturing apparatus 100 will be described.

As shown in FIG. 1, the film-forming target S is brought into contact with the first terminal 102 and the second terminal 103, and is suspended in the air between the first terminal 102 and the second terminal 103.

After the chamber 101 is evacuated, the raw material gas is introduced into the chamber 101 from the gas supply section 105. The raw material gas can be introduced into the chamber 101 at a constant flow rate. Alternatively, the solid or liquid film-forming raw material may be housed and vaporized in the chamber 101 in advance.

Subsequently, voltage is applied between the first terminal 102 and the second terminal 103 by the power supply 104. By doing so, current flows between the first terminal 102 and the second terminal 103 via the film-forming target S, and the film-forming target S is heated (electrically heated) due to electrical resistance.

FIG. 1 shows a region of the film-forming target S, which reaches high temperature due to electrical heating (hereinafter, a heated region H). As shown in the figure, the heated region H is relatively narrow, and is a region of about several cm in a direction in which the first terminal 102 and the second terminal 103 are opposed to each other. Therefore, the reaction space in which the thin film is formed has a volume of 10 cm$^3$ or less. It is favorable that the temperature of the heated region H is 300 K or more.

When the film-forming raw material reaches the heated region H, the state of the film-forming raw material changes due to heat thereof and the film-forming raw material is deposited on the film-forming target S, and a thin film L made of the film-forming material is formed. Any change in state of the film-forming raw material can be performed, and it only needs to enable a thin film to be formed on the film-forming target S. For example, chemical reaction, precipitation, crystallization, or crystal growth is performed.

With other heating methods such as radiation heating using a heater, it takes certain time to perform heating and cooling. However, with the electrical heating, rapid heating and rapid cooling can be achieved by applying voltage and stopping voltage application. Therefore, it is possible to control reaction time for which film-forming progresses in a heated region H1 by using application time of voltage.

Specifically, by setting the application time of voltage on the first terminal 102 and the second terminal 103 to time for which a thin film having a desired number of layers is formed, it becomes possible to control the number of layers. It should be noted that the reaction time is favorably 10 minutes or less.

Further, after a layer made of a particular film-forming material is formed, the film-forming raw material to be supplied to the film-forming target S can also be changed. With this configuration, a thin film (laminated film) in which a plurality of layers made of different kinds of film-forming materials are laminated can also be formed on the film-forming target S.

Application Example

A method of forming a thin film made of hexagonal boron nitride on iron foil by utilizing the thin-film manufacturing apparatus 100 will be described.

Iron foil is, as the film-forming target S, suspended in the air between the first terminal 102 and the second terminal 103. The iron foil can have, for example, a thickness of 50 μm, a width of 30 cm, and a length of 30 m.

The raw material gas is introduced into the chamber 101 from the gas supply section 105. The raw material gas is $BCl_3$ and $NH_3$, and the mixture ratio can be 1:1 and the flow rate can be 5 slm in total.

When voltage of 4V or more is applied between the first terminal 102 and the second terminal 103, the heated region H at 1500° C. is formed due to electrical heating. The heated region H has a range of about 20 mm.

The raw material gas ($BCl_3$ and $NH_3$) causes chemical reaction in the heated region H, and hexagonal boron nitride is generated. The hexagonal boron nitride is deposited on the iron foil, and a thin film made of hexagonal boron nitride is formed. Here, the hexagonal boron nitride forms a multi-layer structure in which multiple layers each having a layer thickness of about 1 nm are laminated. Although depending on conditions, if the film-forming speed of the hexagonal boron nitride is set to 3 μm/min, 50 layers are formed per second.

Therefore, in a case of utilizing a conventional film-forming method (e.g., plasma jet method), it is difficult to quickly stop heating, and it is substantially impossible to stop film-forming when a film having a desired number of layers is formed. In contrast, in the thin-film manufacturing method according to this embodiment, rapid heating and rapid cooling can be achieved, and a thin film made of hexagonal boron nitride having a desired number of layers can be formed.

For example, if electrical heating and supply of the raw material gas are stopped 40 seconds later after heating starts under the above-mentioned condition, a thin film made of hexagonal boron nitride of 10 layers can be formed. It should be noted that whether or not hexagonal boron nitride is formed as a film is determined by using Raman spectroscopy or electron energy loss spectroscopy. Further, the number of layers of hexagonal boron nitride can be checked with a transmission electron microscope or by using electron energy loss spectroscopy.

Second Embodiment

A second embodiment of the present technology will be described.

Figure 2:
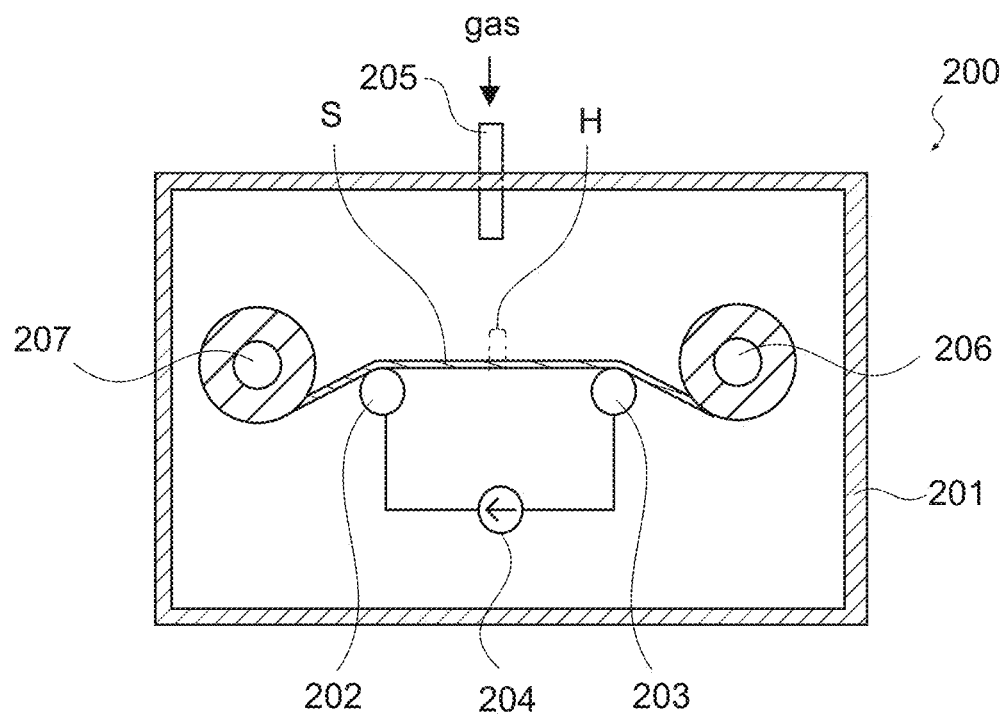
FIG. 2 A schematic view showing a thin-film manufacturing apparatus according to a second embodiment of the present technology.

FIG. 2 is a schematic view showing a thin-film manufacturing apparatus 200 according to this embodiment. As shown in the figure, the thin-film manufacturing apparatus 200 includes a chamber 201, a first terminal 202, a second terminal 203, a power supply 204, a gas supply section 205, a take-up roll 206, and a pay-out roll 207.

The take-up roll 206 and the pay-out roll 207 are set on the film-forming target S. The first terminal 202, the second terminal 203, the take-up roll 206, and the pay-out roll 207 are housed in the chamber 201. The first terminal 202 and the second terminal 203 are each connected to the power supply 204. The gas supply section 205 is connected to the chamber 201.

The film-forming target S can be electrically heated as in the first embodiment and has such a length that it can be wound like a roll.

The take-up roll 206 and the pay-out roll 207 configure a roll-to-roll mechanism. Specifically, the roll-like film-forming target S is set on the pay-out roll 207 and is, at an end thereof, connected to the take-up roll 206.

When the take-up roll 206 is rotated by rotational power, the film-forming target S is wound around the take-up roll 206 and the pay-out roll 207 is accordingly rotated following it, such that the film-forming target S can be conveyed from the pay-out roll 207 to the take-up roll 206. It should be noted that the film-forming target S may be conveyed by a conveying mechanism other than the roll-to-roll mechanism.

The chamber 201 maintains the inside at a predetermined pressure. A gas discharge mechanism such as a vacuum pump may be connected to the chamber 201. The chamber 201 can be a vacuum chamber. The chamber 201 may be a chamber having strength lower than that of the vacuum chamber and only needs to be capable of maintaining a degree of vacuum (or a positive pressure) necessary for a film-forming process.

It should be noted that the chamber 201 does not need to have high thermal resistance, and thus a chamber which is not thermally resistive can be used. Further, the take-up roll 206 and the pay-out roll 207 may be arranged outside the chamber 201 and the film-forming target S may be introduced into the chamber 201 through a partition wall of the chamber 201.

The first terminal 202 and the second terminal 203 are each brought into contact with the film-forming target S. Here, in this embodiment, the film-forming target S is conveyed by the above-mentioned roll-to-roll mechanism, and thus the first terminal 202 and the second terminal 203 need to be capable of being in stable contact with the film-forming target S which is moving.

Specifically, the first terminal 202 and the second terminal 203 are made of an electrically conductive material such as carbon and various types of metal, and can have a circular arc shaped portion to be in contact with at least the film-forming target S. Further, the first terminal 202 and the second terminal 203 can also be rolls made of an electrically conductive material as described above.

The power supply 204 applies voltage between the first terminal 202 and the second terminal 203. The power supply 204 may be a direct-current power supply or may be an alternating-current power supply. The power supply 204 may be arranged inside the chamber 201 or may be arranged outside the chamber 201.

The gas supply section 205 introduces gas of the film-forming raw material (raw material gas) into the chamber 201. the film-forming raw material is a reactive precursor or the like and only needs to react on the film-forming target S and form a thin film made of the film-forming material. By limiting the supply of the raw material gas introduced from the gas supply section 205, it is possible to control the reaction space in which film-forming is performed. The raw material gas can be one or more kinds of gases.

Further, the film-forming raw material is not limited to the gas, and may be a substance in the solid state or the liquid state under ordinary temperature and normal pressure. The film-forming raw material may be, for example, in the solid state or the liquid state, housed in the chamber 201 and be vaporized (sublimated or evaporated) by heating or the like by a vacuum or heating means inside the chamber 201. That is, the film-forming raw material only needs to be a substance that can be, in the gas state, supplied to the film-forming target S.

The thin-film manufacturing apparatus 200 can have the above-mentioned configuration. In the thin-film manufacturing apparatus 200, the film-forming target S is heated by resistance heating, and a portion other than the film-forming target S does not reach excessively high temperature. Therefore, the thin-film manufacturing apparatus 200 can be made of a material selected irrespective of the thermal resistance.

[Regarding Thin-Film Manufacturing Method]

Figure 3:
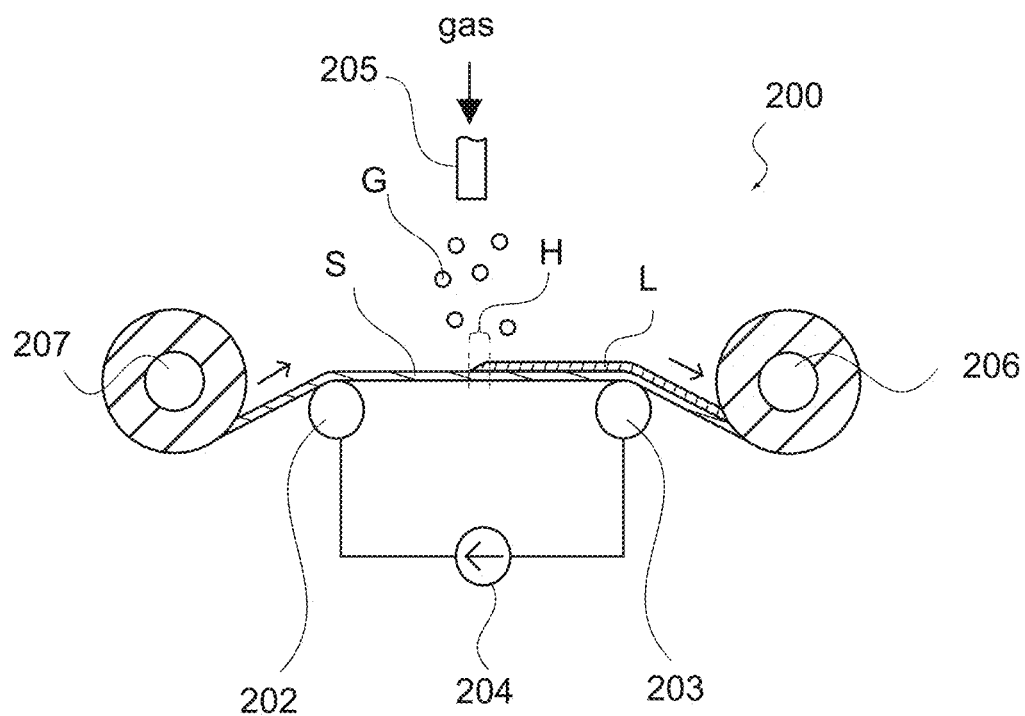
FIG. 3 A schematic view showing a thin-film manufacturing method using the thin-film manufacturing apparatus.

A manufacturing method for a thin film by utilizing the thin-film manufacturing apparatus 200 will be described. FIG. 3 is a schematic view showing a manufacturing method for a thin film, and illustration of the chamber 201 is omitted.

As shown in FIG. 3, the roll of the film-forming target S is set on the pay-out roll 207, and one end of the film-forming target S is connected to the take-up roll 206. With this configuration, the film-forming target S is brought into contact with the first terminal 202 and the second terminal 203, and is suspended in the air between the first terminal 202 and the second terminal 203.

After the chamber 201 is evacuated, the take-up roll 206 is rotated, and the film-forming target S is fed from the pay-out roll 207 to the take-up roll 206. At the same time, the power supply 204 applies voltage between the first terminal 202 and the second terminal 203. By doing so, current flows between the first terminal 102 and the second terminal 103 via the film-forming target S, and the film-forming target S is heated (electrically heated) due to electrical resistance.

FIGS. 2 and 3 show a region of the film-forming target S, which reaches high temperature due to electrical heating (hereinafter, a heated region H). As shown in those figures, the heated region H is relatively narrow, and is a region of approximately several cm in a direction in which the first terminal 202 and the second terminal 203 are opposed to each other. Therefore, the reaction space in which the thin film is formed has a volume of 10 cm$^3$ or less. It is favorable that the temperature of the heated region H is 300 K or more.

Subsequently, a gaseous film-forming raw material G is supplied to the heated region H from the gas supply section 205. The film-forming raw material G can be introduced into the chamber 201 at a constant flow rate. Alternatively, the solid or liquid film-forming raw material may be housed and vaporized in the chamber 201 in advance.

When the film-forming raw material G reaches the heated region H, the state of the film-forming raw material G changes due to heat thereof and the film-forming raw material G is deposited on the film-forming target S, and a thin film L as shown in FIG. 3 is formed. Any change in state of the film-forming raw material G can be performed, and it only needs to enable a thin film to be formed on the film-forming target S. For example, chemical reaction, precipitation, crystallization, or crystal growth is performed.

Although the heated region H is formed between the first terminal 202 and the second terminal 203, the heated region H moves on the film-forming target S by performing electrical heating while conveying the film-forming target S by the roll-to-roll process. Therefore, a point on the film-forming target S passes the heated region H for short time, and rapid heating and rapid cooling occur at the point on the film-forming target S.

Time for which the point on the film-forming target S is heated, that is, the reaction time for which film-forming progresses can be controlled by using the conveyance speed of the film-forming target S. Specifically, by setting the conveyance speed of the film-forming target S to time for which a thin film having a desired number of layers is formed, it becomes possible to control the number of layers. The reaction time is favorably 10 minutes or less and the conveyance speed of the film-forming target S is favorably 10 m per minute or less.

It should be noted that after the thin film is formed on the film-forming target S, another thin film may be laminated on the thin film by performing electrical heating by inverting the roll-to-roll conveyance direction. Further, after a layer made of a particular film-forming material is formed, the film-forming raw material to be supplied to the heated region H can also be changed to thereby form a thin film in which a plurality of layers made of different kinds of film-forming materials are laminated on the film-forming target S.

Application Example

A method of forming a thin film made of hexagonal boron nitride (hBN) on iron foil by utilizing the thin-film manufacturing apparatus 200 will be described.

Iron foil is, as the film-forming target S, set on the pay-out roll 207, and one end of the film-forming target S is connected to the take-up roll 206. The iron foil can have, for example, a thickness of 50 μm, a width of 30 cm, and a length of 30 m.

The film-forming target S is fed from the pay-out roll 207 to the take-up roll 206. The feeding speed can be, for example, 0.56 mm/sec. When voltage of 4V or more is applied between the first terminal 202 and the second terminal 203, the heated region at 1500° C. is formed due to electrical heating. The heated region has a range of about 20 mm.

The raw material gas is introduced into the heated region H from the gas supply section 205. The raw material gas is $BCl_3$ and $NH_3$ and the mixture ratio can be 1:1 and the flow rate can be 5 slm in total.

The raw material gas ($BCl_3$ and $NH_3$) causes chemical reaction in the heated region H, and hexagonal boron nitride is generated. The hexagonal boron nitride is deposited on the iron foil, and a thin film made of hexagonal boron nitride is formed. As described above, although depending on conditions, if the film-forming speed of the hexagonal boron nitride is set to 3 μm/min, 50 layers are formed per second.

Therefore, rapid heating and rapid cooling are necessary to perform number-of-layers control of hexagonal boron nitride, and in the thin-film manufacturing method according to this embodiment, rapid heating and rapid cooling can be achieved. In addition, the time for which the point on the film-forming target S passes the heated region H can be adjusted by using the roll-to-roll conveyance speed, and a hexagonal boron nitride thin film having an arbitrary number of layers can be formed.

Figure 4:
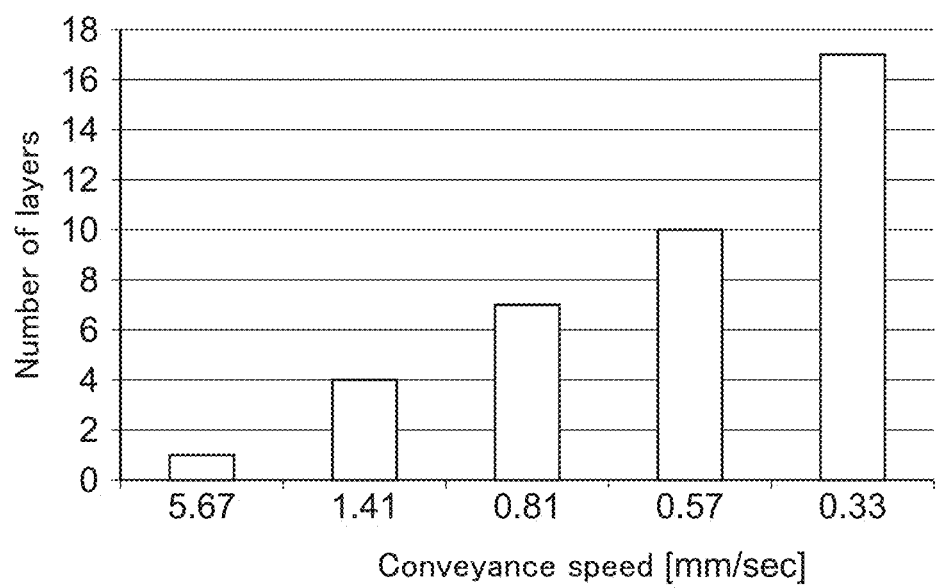
FIG. 4 A graph showing a relationship between a roll-to-roll conveyance speed and the number of layers of hexagonal boron nitride to be formed as a film.

FIG. 4 is a graph showing a relationship between the roll-to-roll conveyance speed and the number of layers of hexagonal boron nitride. As can be seen from the figure, the number of layers of hexagonal boron nitride depends on the roll-to-roll conveyance speed, and the number of layers greatly varies in a manner that depends on the conveyance speed. Therefore, a hexagonal boron nitride thin film having an arbitrary number of layers can be formed with the film-forming method according to this embodiment. For example, if the conveyance speed of the film-forming target S is set to 0.57 mm/sec, hexagonal boron nitride having about 10 layers is formed as a film.

After the film-forming target S having an arbitrary length is taken up, the supply and application of voltage of the raw material gas are stopped. It should be noted that whether or not hexagonal boron nitride is formed as a film is determined by using Raman spectroscopy or electron energy loss spectroscopy. Further, the number of layers of hexagonal boron nitride can be checked with a transmission electron microscope or by using electron energy loss spectroscopy.

Third Embodiment

A third embodiment of the present technology will be described.

Figure 5:
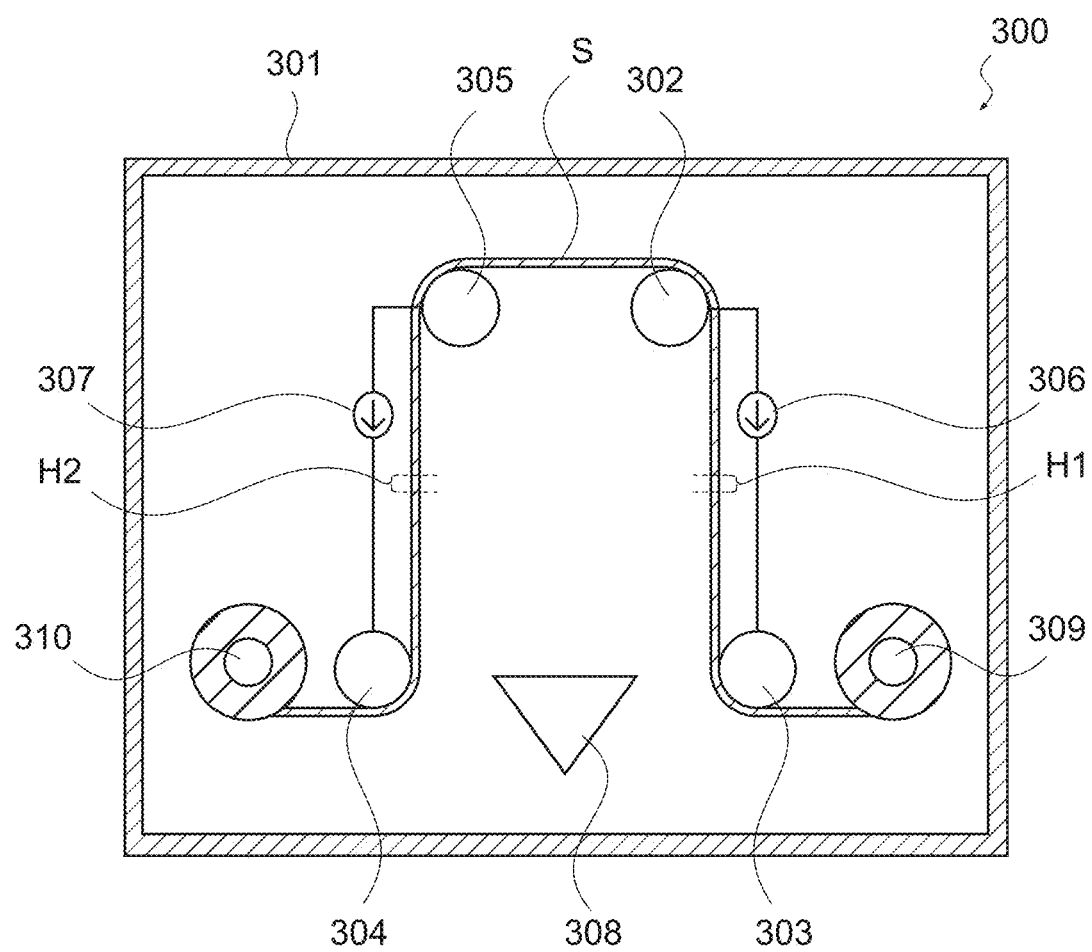
FIG. 5 A schematic view showing a thin-film manufacturing apparatus according to a third embodiment of the present technology.

FIG. 5 is a schematic view showing a thin-film manufacturing apparatus 300 according to this embodiment. As shown in the figure, the thin-film manufacturing apparatus 300 includes a chamber 301, a first terminal 302, a second terminal 303, a third terminal 304, a fourth terminal 305, a first power supply 306, a second power supply 307, a crucible 308, a take-up roll 309, and a pay-out roll 310.

The film-forming target S is set on the take-up roll 309 and the pay-out roll 310. The first terminal 302, the second terminal 303, the third terminal 304, the fourth terminal 305, the crucible 308, the take-up roll 309, and the pay-out roll 310 are housed in the chamber 301. The first terminal 302 and the second terminal 303 are each connected to the first power supply 306, and the third terminal 304 and the fourth terminal 305 are each connected to the second power supply 307.

The film-forming target S can be electrically heated as in the first embodiment and has such a length that it can be wound like a roll.

The take-up roll 309 and the pay-out roll 310 configure a roll-to-roll mechanism. Specifically, the roll-like film-forming target S is set on the pay-out roll 310 and is, at one end thereof, connected to the take-up roll 309. When the take-up roll 309 is rotated by rotational power, the film-forming target S is wound around the take-up roll 309 and the pay-out roll 310 is accordingly rotated following it, such that the film-forming target S can be conveyed from the pay-out roll 310 to the take-up roll 309. It should be noted that the film-forming target S may be conveyed by a conveying mechanism other than the roll-to-roll mechanism.

The chamber 301 maintains the inside at a predetermined pressure. A gas discharge mechanism such as a vacuum pump may be connected to the chamber 301. The chamber 301 can be a vacuum chamber. The chamber 301 may be a chamber having strength lower than that of the vacuum chamber and only needs to be capable of maintaining a degree of vacuum (or a positive pressure) necessary for a film-forming process.

It should be noted that the chamber 301 does not need to have high thermal resistance, and thus a chamber which is not thermally resistive can be used. Further, the take-up roll 309 and the pay-out roll 310 may be arranged outside the chamber 301 and the film-forming target S may be introduced into the chamber 301 through a partition wall of the chamber 301.

The first terminal 302, the second terminal 303, the third terminal 304, and the fourth terminal 305 are each brought into contact with the film-forming target S. Here, in this embodiment, the film-forming target S is conveyed by the above-mentioned roll-to-roll mechanism, and thus the first terminal 302, the second terminal 303, the third terminal 304, and the fourth terminal 305 need to be capable of being in stable contact with the film-forming target S which is moving.

Specifically, those terminals are made of an electrically conductive material such as carbon and various types of metal, and can have a circular arc shaped portion to be in contact with at least the film-forming target S. Further, those terminals can also be rolls made of an electrically conductive material as described above.

The respective terminals are arranged such that the film-forming target S comes into contact with the third terminal 304, the fourth terminal 305, the first terminal 302, and the second terminal 303 in the stated order from the side of the pay-out roll 310. Although the arrangement of the respective terminals is not particularly limited, as shown in FIG. 5, it is favorable to arrange them such that the film-forming target S between the third terminal 304 and the fourth terminal 305 and the film-forming target S between the first terminal 302 and the second terminal 303 are opposed to each other.

The first power supply 306 applies voltage between the first terminal 302 and the second terminal 303 and the second power supply 307 applies voltage between the third terminal 304 and the fourth terminal 305. The first power supply 306 and the second power supply 307 may be direct-current power supplies or may be alternating-current power supplies. Further, the first power supply 306 and the second power supply 307 may be arranged inside the chamber 301 or may be arranged outside the chamber 301.

The crucible 308 contains and heats the film-forming raw material to thereby generate gas of the film-forming raw material (hereinafter, raw material gas). The film-forming raw material is a reactive precursor or the like and only needs to react on the film-forming target S and form a thin film made of the film-forming material. Further, the thin-film manufacturing apparatus 300 may include a gas supply section capable of introducing the gas into the chamber 301 instead of the crucible 308.

The thin-film manufacturing apparatus 300 can have the above-mentioned configuration. In the thin-film manufacturing apparatus 300, the film-forming target S is heated by resistance heating, and a portion other than the film-forming target S does not reach excessively high temperature. Therefore, the thin-film manufacturing apparatus 300 can be made of a material selected irrespective of the thermal resistance.

[Regarding Thin-Film Manufacturing Method]

Figure 6:
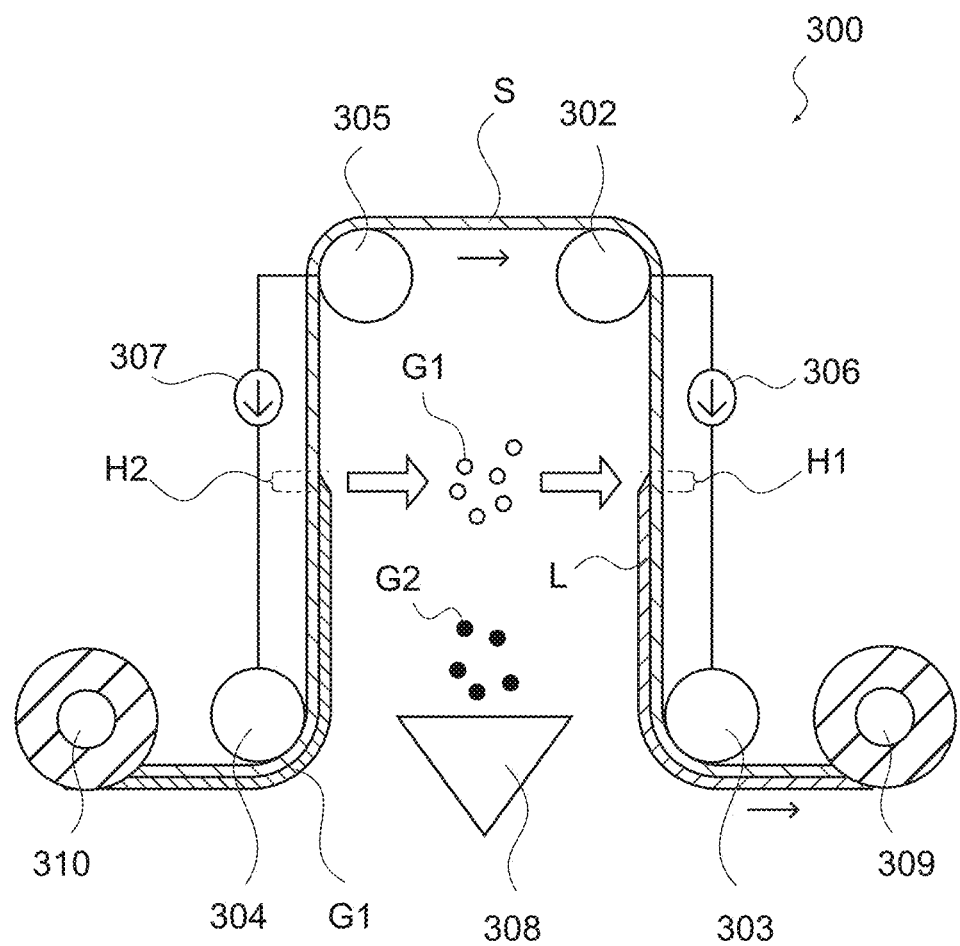
FIG. 6 A schematic view showing a thin-film manufacturing method using the thin-film manufacturing apparatus.

A manufacturing method for a thin film by utilizing the thin-film manufacturing apparatus 300 will be described. FIG. 6 is a schematic view showing a manufacturing method for a thin film, and illustration of the chamber 301 is omitted.

As shown in the figure, the roll of the film-forming target S is set on the pay-out roll 310, and one end of the film-forming target S is connected to the take-up roll 309. With this configuration, the film-forming target S comes into contact with the first terminal 302, the second terminal 303, the third terminal 304, and the fourth terminal 305.

A film-forming raw material (hereinafter, a film-forming raw material G1) is made to adhere to the film-forming target S in advance. The film-forming raw material G1 may be liquid or solid and may be, for example, dispersion liquid obtained by dispersing powder in liquid. The film-forming raw material G1 can be made to adhere to the film-forming target S by any technique such as splaying, immersion, and screen coating.

After the chamber 301 is evacuated, the take-up roll 309 is rotated, and the film-forming target S is fed from the pay-out roll 310 to the take-up roll 309. At the same time, the first power supply 306 applies voltage between the first terminal 302 and the second terminal 303. By doing so, current flows between the first terminal 302 and the second terminal 303 via the film-forming target S, and the film-forming target S is heated (electrically heated) due to electrical resistance.

FIGS. 5 and 6 show a region (hereinafter, a heated region H1) of the film-forming target S, which reaches high temperature due to electrical heating between the first terminal 302 and the second terminal 303. As shown in those figures, the heated region H1 is relatively narrow, and is a region of approximately several cm in a direction in which the first terminal 302 and the second terminal 303 are opposed to each other. Therefore, the reaction space in which the thin film is formed has a volume of 10 cm$^3$ or less. It is favorable that the temperature of the heated region H1 is 300 K or more.

Further, the second power supply 307 applies voltage between the third terminal 304 and the fourth terminal 305. By doing so, current flows between the third terminal 304 and the fourth terminal 305 via the film-forming target S, and the film-forming target S is heated (electrically heated) due to electrical resistance.

FIGS. 5 and 6 show a region (hereinafter, a heated region H2) of the film-forming target S, which reaches high temperature due to electrical heating between the third terminal 304 and the fourth terminal 305. As shown in the figure, the heated region H2 is relatively narrow, and is a region of approximately several cm in a direction in which the third terminal 304 and the fourth terminal 305 are opposed to each other. It is favorable that the temperature of the heated region H2 is 300 K or more.

In addition, a film-forming raw material (hereinafter, a film-forming raw material G2) contained in the crucible 308 is heated and the film-forming raw material G2 is vaporized by the crucible 308. Further, the raw material gas may be introduced into the chamber 301 by the gas supply section.

The film-forming raw material G1 is heated and vaporized in the heated region H2. The vaporized film-forming raw material G1 is mixed in the film-forming raw material G2 supplied from the crucible 308, and reaches the heated region H1. The mixture of the film-forming raw material G1 and the film-forming raw material G2 is changed in state due to heat of the heated region H1 and is deposited on the film-forming target S. In this manner, a film is formed.

Any change in state of the film-forming raw material can be performed, and it only needs to enable a thin film to be formed on the film-forming target S. For example, chemical reaction, precipitation, crystallization, or crystal growth is performed. In this manner, the film-forming raw material G1 is supplied from the heated region H2 to the heated region H1. Therefore, it is favorable that the heated region H1 and the heated region H2 are in a positional relationship in which these are opposed to each other.

Further, the film-forming raw material G2 is mixed in the film-forming raw material G1 and is supplied to the heated region H1. Therefore, the crucible 308 is favorably positioned so as to supply the film-forming raw material G2 into a space between the heated region H1 and the heated region H2.

By performing electrical heating while conveying the film-forming target S by the roll-to-roll process, the heated region H2 is moved on the film-forming target S. Therefore, a point on the film-forming target S passes the heated region H2 for short time, and rapid heating and rapid cooling occur at the point on the film-forming target S.

Therefore, the film-forming raw material G1 is vaporized in the heated region H2 by a constant amount each time and the film-forming raw material G1 is supplied to the heated region H1 by a constant amount each time. With this configuration, a necessary amount of film-forming raw material G1, for example, an amount of film-forming raw material G1 that provides an ideal composition ratio for chemical reaction caused in the heated region H1 can be supplied to the heated region H1.

Further, by performing electrical heating while conveying the film-forming target S by the roll-to-roll process, the heated region H1 also moves on the film-forming target S. Therefore, a point on the film-forming target S passes the heated region H1 for short time, and rapid heating and rapid cooling occur at the point on the film-forming target S.

Time for which the point on the film-forming target S is heated, that is, the reaction time for which film-forming progresses can be controlled by using the conveyance speed of the film-forming target S. Specifically, in a case where the film-forming material is a material that grows in a layered form, by setting the conveyance speed of the film-forming target S to time for which a thin film having a desired number of layers is formed, it becomes possible to control the number of layers. The reaction time is favorably 10 minutes or less and the conveyance speed of the film-forming target S is favorably 10 m per minute or less.

It should be noted that after the thin film is formed on the film-forming target S, another thin film may be laminated on the thin film by performing electrical heating by inverting the roll-to-roll conveyance direction. Further, after a layer made of a particular film-forming material is formed, the film-forming raw material to be supplied to the heated region H1 can also be changed to thereby form a thin film in which a plurality of layers made of different kinds of film-forming materials are laminated on the film-forming target S.

Application Example

A method of forming a thin film made of molybdenum disulfide ($Mo S_2$) on gold foil or iron foil by utilizing the thin-film manufacturing apparatus 300 will be described.

The gold foil or the iron foil is, as the film-forming target S, set on the pay-out roll 310, and one end of the film-forming target S is connected to the take-up roll 309. The film-forming target S is brought into contact with the first terminal 302, the second terminal 303, the third terminal 304, and the fourth terminal 305.

Molybdenum chloride (V) ($MoCl_5$) is applied to the film-forming target S as the film-forming raw material G1 in advance. Dispersion liquid obtained by dispersing powder of molybdenum chloride (V) can be applied to the film-forming target S by splaying, immersion, screen coating, or the like. This application may be performed in advance or may be performed in the chamber 301.

Voltage is applied between the first terminal 302 and the second terminal 303 and voltage is also applied between the third terminal 304 and the fourth terminal 305. Further, sulfur (S) is contained in the crucible 308 as the film-forming raw material G2 and heated to 450° C. or more. Under this state, the film-forming target S is conveyed by the roll-to-roll process.

The heated region H2 is formed due to electrical heating between the third terminal 304 and the fourth terminal 305 and molybdenum chloride (V) is sublimated in the heated region H2. It is favorable that the temperature of the heated region H2 is about 300° C.

Further, the sublimated sulfur is supplied from the crucible 308 and mixed in the molybdenum chloride (V). The mixture of the sulfur and the molybdenum chloride (V) reaches the heated region H1 formed due to electrical heating between the first terminal 302 and the second terminal 303, and molybdenum disulfide is formed. It is favorable that the temperature of the heated region H1 is about 850° C.

Molybdenum disulfide is precipitated on the film-forming target S and causes crystal growth. The heating range of the heated region H1 is about 2 cm, and it is rapidly cooled to the room temperature in a region in front of and behind that range. By controlling the roll-to-roll conveyance speed in cm/second and setting the reaction time of molybdenum disulfide in seconds, the total number of two-dimensional thin films of molybdenum disulfide can be controlled within a range of 1 to 10 layers or more.

Fourth Embodiment

A fourth embodiment of the present technology will be described.

Figure 7:
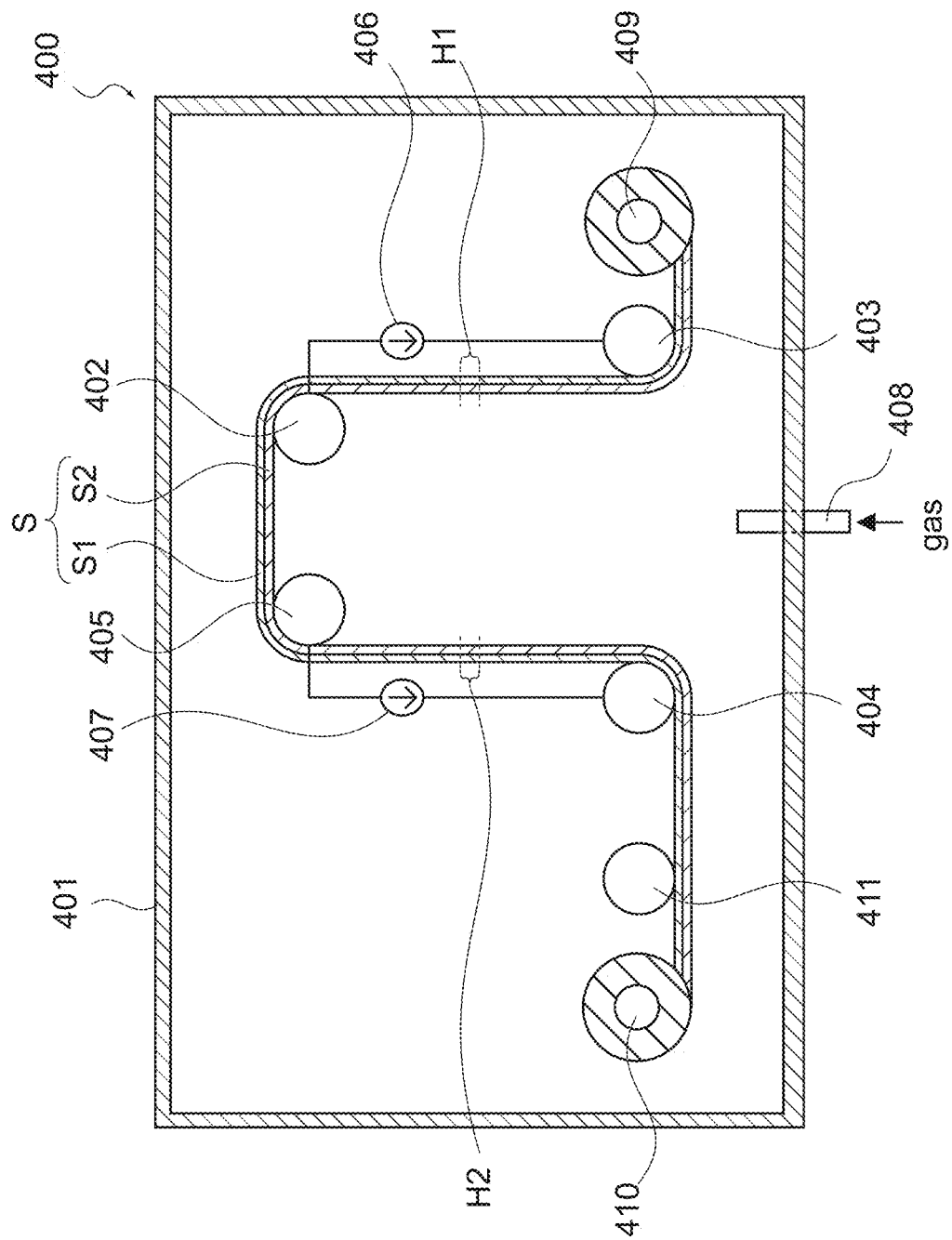
FIG. 7 A schematic view showing a thin-film manufacturing apparatus according to a fourth embodiment of the present technology.

FIG. 7 is a schematic view showing a thin-film manufacturing apparatus 400 according to this embodiment. As shown in the figure, the thin-film manufacturing apparatus 400 includes a chamber 401, a first terminal 402, a second terminal 403, a third terminal 404, a fourth terminal 405, a first power supply 406, a second power supply 407, a gas supply section 408, a take-up roll 409, a pay-out roll 410, and a guide roll 411.

The film-forming target S is set on the take-up roll 409 and the pay-out roll 410. The first terminal 402, the second terminal 403, the third terminal 404, the fourth terminal 405, the take-up roll 409, and the pay-out roll 410 are housed in the chamber 201. The first terminal 402 and the second terminal 403 are each connected to the first power supply 406 and the fourth terminal 404 and the fourth terminal 405 are each connected to the second power supply 407. The gas supply section 408 is connected to the chamber 401.

The film-forming target S can be electrically heated as in the first embodiment and has such a length that it can be wound like a roll.

The take-up roll 409 and the pay-out roll 410 configure a roll-to-roll mechanism. Specifically, the roll-like film-forming target S is set on the pay-out roll 410 and is, at one end thereof, connected to the take-up roll 409. When the take-up roll 409 is rotated by rotational power, the film-forming target S is wound around the take-up roll 409 and the pay-out roll 410 is accordingly rotated following it, such that the film-forming target S can be conveyed from the pay-out roll 410 to the take-up roll 409. It should be noted that the film-forming target S may be conveyed by a conveying mechanism other than the roll-to-roll mechanism.

The chamber 401 maintains the inside at a predetermined pressure. A gas discharge mechanism such as a vacuum pump may be connected to the chamber 401. The chamber 401 can be a vacuum chamber. The chamber 401 may be a chamber having strength lower than that of the vacuum chamber and only needs to be capable of maintaining a degree of vacuum (or a positive pressure) necessary for a film-forming process.

It should be noted that the chamber 401 does not need to have high thermal resistance, and thus a chamber which is not thermally resistive can be used. Further, the take-up roll 409 and the pay-out roll 410 may be arranged outside the chamber 401 and the film-forming target S may be introduced into the chamber 401 through a partition wall of the chamber 401.

The first terminal 402, the second terminal 403, the third terminal 404, and the fourth terminal 405 are each brought into contact with the film-forming target S. Here, in this embodiment, the film-forming target S is conveyed by the above-mentioned roll-to-roll mechanism, and thus the first terminal 402, the second terminal 403, the third terminal 404, and the fourth terminal 405 need to be capable of being in stable contact with the film-forming target S which is moving.

Specifically, those terminals are made of an electrically conductive material such as carbon and various types of metal, and can have a circular arc shaped portion to be in contact with at least the film-forming target S. Further, those terminals can also be rolls made of an electrically conductive material as described above.

The respective terminals are arranged such that the film-forming target S comes into contact with the third terminal 404, the fourth terminal 405, the first terminal 402, and the second terminal 403 in the stated order from the side of the pay-out roll 410. Although the arrangement of the respective terminals is not particularly limited, as shown in FIG. 7, it is favorable to arrange them such that the film-forming target S between the third terminal 404 and the fourth terminal 405 and the film-forming target S between the first terminal 402 and the second terminal 403 are opposed to each other.

The first power supply 406 applies voltage between the first terminal 402 and the second terminal 403 and the second power supply 407 applies voltage between the third terminal 404 and the fourth terminal 405. The first power supply 406 and the second power supply 407 may be direct-current power supplies or may be alternating-current power supplies. Further, the first power supply 406 and the second power supply 407 may be arranged inside the chamber 401 or may be arranged outside the chamber 401.

The gas supply section 408 introduces gas of the film-forming raw material (hereinafter, raw material gas) into the chamber 401. The film-forming raw material is a reactive precursor or the like and only needs to react on the film-forming target S and form a thin film made of the film-forming material. The raw material gas can be one or more kinds of gases.

The thin-film manufacturing apparatus 400 can have the above-mentioned configuration. In the thin-film manufacturing apparatus 400, the film-forming target S is heated by resistance heating, and a portion other than the film-forming target S does not reach excessively high temperature. Therefore, the thin-film manufacturing apparatus 400 can be made of a material selected irrespective of the thermal resistance.

[Regarding Thin-Film Manufacturing Method]

Figure 8:
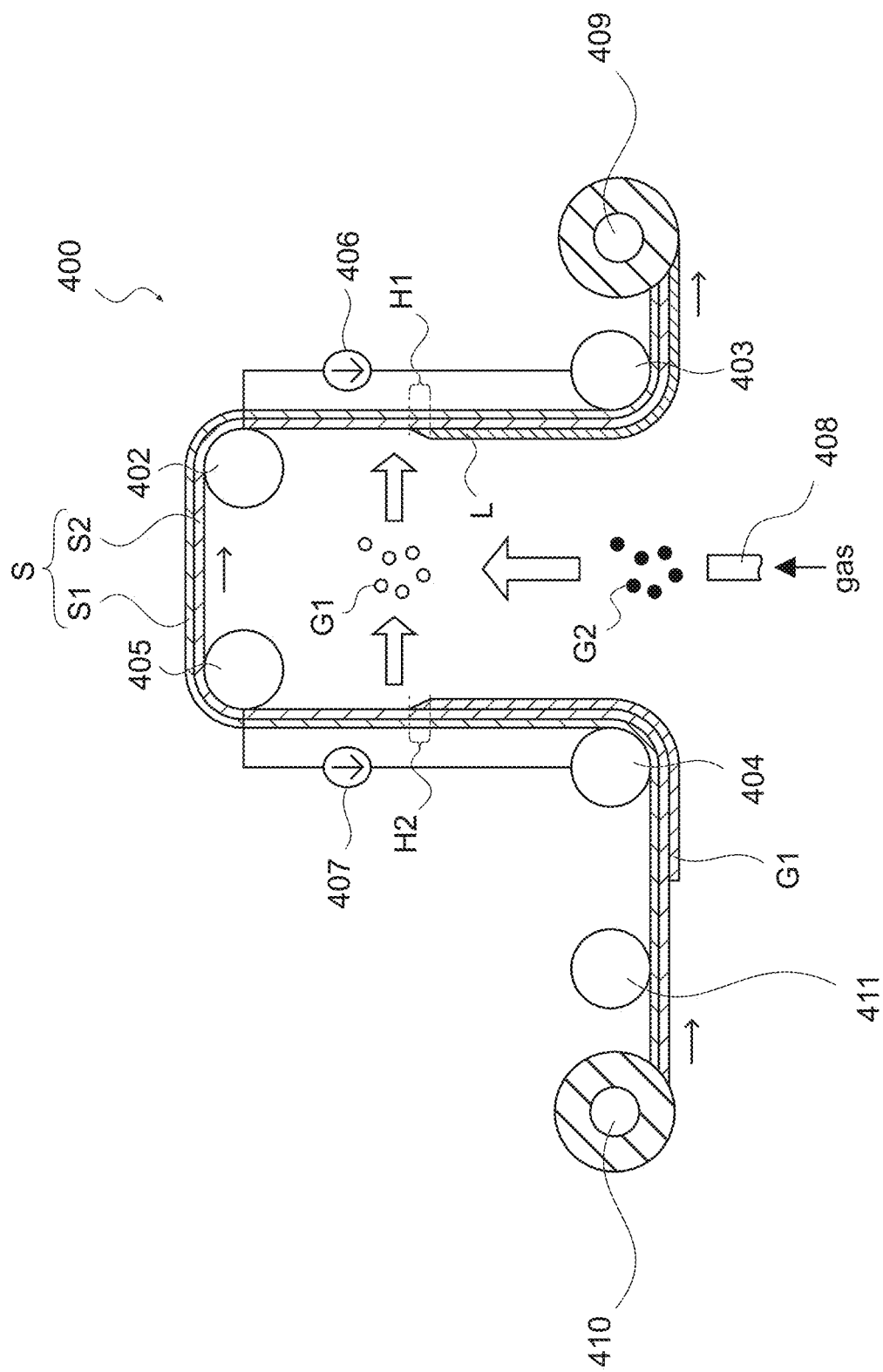
FIG. 8 A schematic view showing a thin-film manufacturing method using the thin-film manufacturing apparatus.

A manufacturing method for a thin film by utilizing the thin-film manufacturing apparatus 400 will be described. FIG. 8 is a schematic view showing a manufacturing method for a thin film, and illustration of the chamber 401 is omitted.

As shown in the figure, the roll of the film-forming target S is set on the pay-out roll 410 and one end of the film-forming target S is connected to the take-up roll 409. With this configuration, the film-forming target S comes into contact with the first terminal 402, the second terminal 403, the third terminal 404, and the fourth terminal 405.

The film-forming target S can be obtained by laminating the electrically conductive layer S2 on the metal foil S1. The metal foil S1 is, for example, copper foil and the electrically conductive layer S2 is, for example, graphene.

A film-forming raw material (hereinafter, a film-forming raw material G1) is made to adhere onto the electrically conductive layer S2 in advance. The film-forming raw material G1 may be liquid or solid and may be, for example, dispersion liquid obtained by dispersing powder in liquid. The film-forming raw material G1 can be made to adhere to the film-forming target S by any technique such as splaying, immersion, and screen coating.

After the chamber 401 is evacuated, the take-up roll 409 is rotated, and the film-forming target S is fed from the pay-out roll 410 to the take-up roll 409. At the same time, the first power supply 406 applies voltage between the first terminal 402 and the second terminal 403. By doing so, current flows between the first terminal 402 and the second terminal 403 via the film-forming target S, and the film-forming target S is heated (electrically heated) due to electrical resistance.

FIGS. 7 and 8 show a region (hereinafter, a heated region H1) of the film-forming target S, which reaches high temperature due to electrical heating between the first terminal 402 and the second terminal 403. As shown in those figures, the heated region H1 is relatively narrow, and is a region of approximately several cm in a direction in which the first terminal 402 and the second terminal 403 are opposed to each other. Therefore, the reaction space in which the thin film is formed has a volume of 10 cm$^3$ or less. It is favorable that the temperature of the heated region H1 is 300 K or more.

Further, the second power supply 407 applies voltage between the third terminal 404 and the fourth terminal 405. By doing so, current flows between the third terminal 404 and the fourth terminal 405 via the film-forming target S, and the film-forming target S is heated (electrically heated) due to electrical resistance.

FIGS. 7 and 8 show a region (hereinafter, a heated region H2) of the film-forming target S, which reaches high temperature due to electrical heating between the third terminal 404 and the fourth terminal 405. As shown in the figure, the heated region H2 is relatively narrow, and is a region of approximately several cm in a direction in which the third terminal 404 and the fourth terminal 405 are opposed to each other. It is favorable that the temperature of the heated region H2 is 300 K or more.

In addition, the raw material gas is introduced into the chamber 401 from the gas supply section 408 as a film-forming raw material (hereinafter, a film-forming raw material G2). The raw material gas can be introduced into the chamber 401 at a constant flow rate. Alternatively, the solid or liquid film-forming raw material may be housed and vaporized in the chamber 401 in advance.

The film-forming raw material G1 is heated and vaporized in the heated region H2. The vaporized film-forming raw material G1 is mixed in the film-forming raw material G2 supplied from the gas supply section 408, and reaches the heated region H1. The mixture of the film-forming raw material G1 and the film-forming raw material G2 is changed in state due to heat of the heated region H1 and is deposited on the film-forming target S. In this manner, a thin film L is formed.

Any change in state of the film-forming raw material can be performed, and it only needs to enable a thin film to be formed on the film-forming target S. For example, chemical reaction, precipitation, or crystallization is performed. In this manner, the film-forming raw material G1 is supplied from the heated region H2 to the heated region H1. Therefore, it is favorable that the heated region H1 and the heated region H2 are in a positional relationship in which these are opposed to each other.

Further, the film-forming raw material G2 is mixed in the film-forming raw material G1 and is supplied to the heated region H1. Therefore, the gas supply section 408 is favorably positioned so as to supply the film-forming raw material G2 into a space between the heated region H1 and the heated region H2.

By performing electrical heating while conveying the film-forming target S by the roll-to-roll process, the heated region H2 is moved on the film-forming target S. Therefore, a point on the film-forming target S passes the heated region H2 for short time, and rapid heating and rapid cooling occur at the point on the film-forming target S.

Therefore, the film-forming raw material G1 is vaporized in the heated region H2 by a constant amount each time and the film-forming raw material G1 is supplied to the heated region H1 by a constant amount each time. With this configuration, a necessary amount of film-forming raw material G1, for example, an amount of film-forming raw material G1 that provides an ideal composition ratio for chemical reaction caused in the heated region H1 can be supplied to the heated region H1.

Further, by performing electrical heating while conveying the film-forming target S by the roll-to-roll process, the heated region H1 also moves on the film-forming target S. Therefore, a point on the film-forming target S passes the heated region H1 for short time, and rapid heating and rapid cooling occur at the point on the film-forming target S.

Time for which the point on the film-forming target S is heated, that is, the reaction time for which film-forming progresses can be controlled by using the conveyance speed of the film-forming target S. Specifically, by setting the conveyance speed of the film-forming target S to time for which a thin film having a desired number of layers is formed, it becomes possible to control the number of layers. The reaction time is favorably 10 minutes or less and the conveyance speed of the film-forming target S is favorably 10 m per minute or less.

It should be noted that after the thin film is formed on the film-forming target S, another thin film may be laminated on the thin film by performing electrical heating by inverting the roll-to-roll conveyance direction. Further, after a layer made of a particular film-forming material is formed, the film-forming raw material to be introduced into the chamber 401 can also be changed to thereby form a thin film in which a plurality of layers made of different kinds of film-forming materials are laminated on the film-forming target S.

Application Example

A method of forming a thin film made of graphene and hexagonal boron nitride (hBN) on the copper foil by utilizing the thin-film manufacturing apparatus 400 will be described.

Graphene formed as a film on the copper foil is, as the film-forming target S, set to the pay-out roll 410, and one end of the film-forming target S is connected to the take-up roll 409. The film-forming target S is brought into contact with the first terminal 402, the second terminal 403, the third terminal 404, and the fourth terminal 405.

The graphene may be formed as a film on the copper foil in advance or may be formed as a film in the chamber 401. In a case of performing film-forming in the chamber 401, the film-forming can be performed by heating the copper foil due to electrical heating and supplying carbon source gas. The carbon source gas is gas including carbon atoms such as carbon monoxide, methane, and ethane.

Liquid organic metal trimethyl borate is applied to graphene (electrically conductive layer S2) as the film-forming raw material G1 in advance. The organic metal trimethyl borate can be applied to the graphene by splaying, immersion, screen coating, or the like. This application may be performed in advance or may be performed in the chamber 401.

Voltage is applied between the first terminal 402 and the second terminal 403 and voltage is also applied between the third terminal 404 and the fourth terminal 405. Further, nitrogen gas is introduced into the chamber from the gas supply section 408 as the film-forming raw material G2. Under this state, the film-forming target S is conveyed by the roll-to-roll process.

The heated region H2 is formed due to electrical heating between the third terminal 404 and the fourth terminal 405 and organic metal trimethyl borate is sublimated in the heated region H2. It is favorable that the temperature of the heated region H2 is about 80° C.

The nitrogen supplied from the gas supply section 408 and the organic metal trimethyl borate are mixed. This mixture reaches the heated region H1 formed due to electrical heating between the first terminal 402 and the second terminal 403 and hexagonal boron nitride is formed. It is favorable that the temperature of the heated region H1 is about 1800° C.

The hexagonal boron nitride is deposited on the graphene and causes crystal growth. The heating range of the heated region H1 is about 2 cm, and it is rapidly cooled to the room temperature in a region in front of and behind that range. By controlling the roll-to-roll conveyance speed in cm/second and setting the reaction time of hexagonal boron nitride in seconds, the total number of two-dimensional thin films of hexagonal boron nitride can be controlled within a range of 1 to 10 layers or more.

As described above, different kinds of laminated films made of graphene and hexagonal boron nitride can be formed on the copper foil. Such different kinds of laminated films form heterojunction between the layers.

Fifth Embodiment

A fifth embodiment of the present technology will be described.

Figure 9:
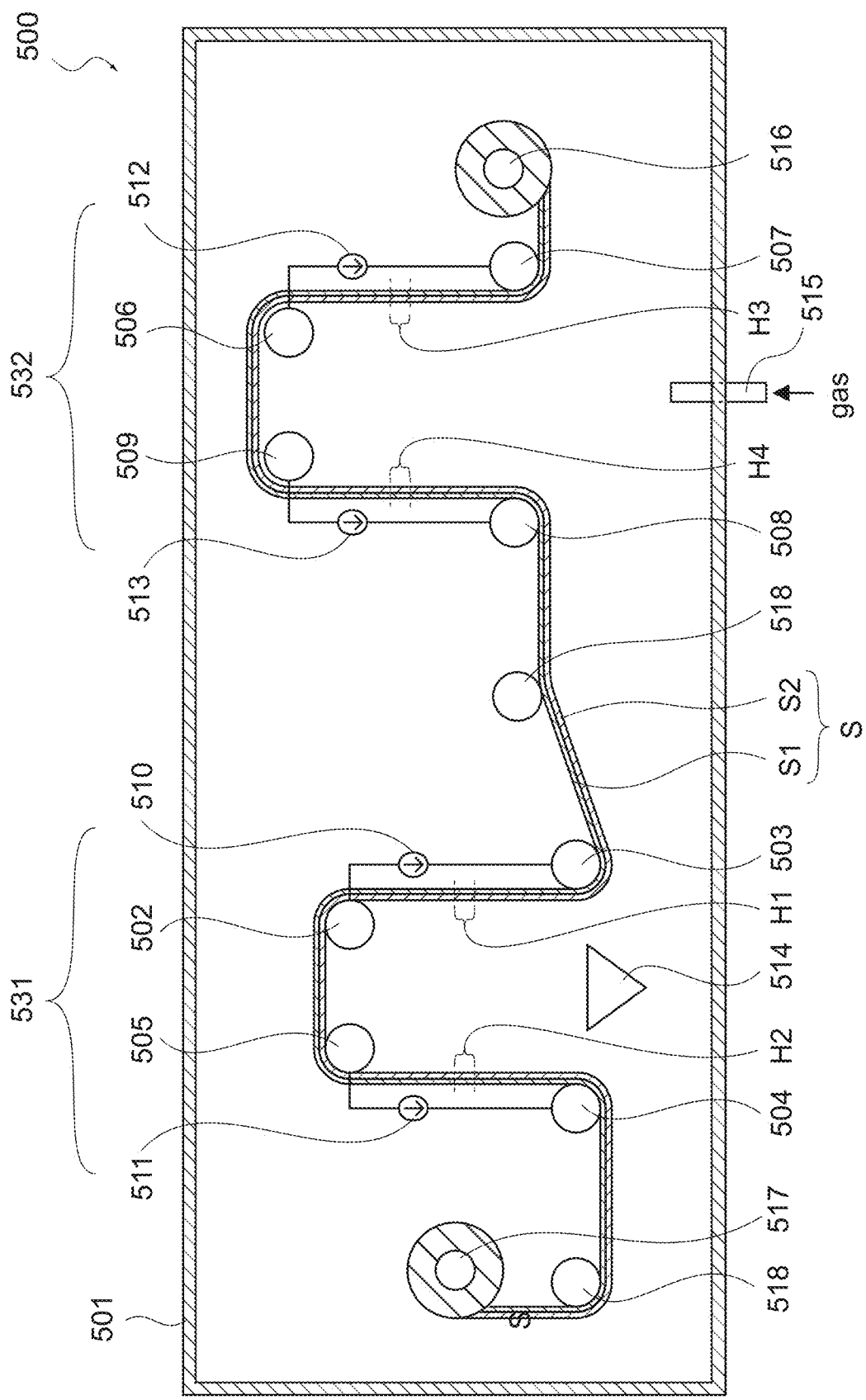
FIG. 9 A schematic view showing a thin-film manufacturing apparatus according to a fifth embodiment of the present technology.

FIG. 9 is a schematic view showing a thin-film manufacturing apparatus 500 according to this embodiment. As shown in the figure, the thin-film manufacturing apparatus 500 includes a chamber 501, a first terminal 502, a second terminal 503, a third terminal 504, a fourth terminal 505, a fifth terminal 506, a sixth terminal 507, a seventh terminal 508, an eighth terminal 509, a first power supply 510, a second power supply 511, a third power supply 512, a fourth power supply 513, a crucible 514, a gas supply section 515, a take-up roll 516, a pay-out roll 517, and a guide roll 518.

It should be noted that a section including the first terminal 502, the second terminal 503, the third terminal 504, the fourth terminal 505, the second power supply 511, and the third power supply 512 will be referred to as a first film-forming section 531 and a section including the fifth terminal 506, the sixth terminal 507, the seventh terminal 508, the eighth terminal 509, the third power supply 512, and the fourth power supply 513 will be referred to as a second film-forming section 532.

The film-forming target S is set on the take-up roll 516 and the pay-out roll 517. The first terminal 502, the second terminal 503, the third terminal 504, the fourth terminal 505, the fifth terminal 506, the sixth terminal 507, the seventh terminal 508, and the eighth terminal 509 are housed in the chamber 501.

The first terminal 502 and the second terminal 503 are each connected to the first power supply 510 and the third terminal 504 and the fourth terminal 505 are each connected to the second power supply 511. The fifth terminal 506 and the sixth terminal 507 are each connected to the third power supply 512 and the seventh terminal 508 and the eighth terminal 509 are each connected to the fourth power supply 513. The gas supply section 515 is connected to the chamber 501.

The film-forming target S can be electrically heated as in the first embodiment and has such a length that it can be wound like a roll.

The take-up roll 516 and the pay-out roll 517 configure a roll-to-roll mechanism. Specifically, the roll-like film-forming target S is set on the pay-out roll 517 and is, at one end thereof, connected to the take-up roll 516. When the take-up roll 516 is rotated by rotational power, the film-forming target S is wound around the take-up roll 516 and the pay-out roll 517 is accordingly rotated following it, such that the film-forming target S can be conveyed from the pay-out roll 517 to the take-up roll 516. It should be noted that the film-forming target S may be conveyed by a conveying mechanism other than the roll-to-roll mechanism.

The chamber 501 maintains the inside at a predetermined pressure. A gas discharge mechanism such as a vacuum pump may be connected to the chamber 501. The chamber 501 can be a vacuum chamber. The chamber 501 may be a chamber having strength lower than that of the vacuum chamber and only needs to be capable of maintaining a degree of vacuum (or a positive pressure) necessary for a film-forming process.

It should be noted that the chamber 501 does not need to have high thermal resistance, and thus a chamber which is not thermally resistive can be used. Further, the take-up roll 516 and the pay-out roll 517 may be arranged outside the chamber 501 and the film-forming target S may be introduced into the chamber 501 through a partition wall of the chamber 501. Further, the first film-forming section 531 and the second film-forming section 531 may be each housed in different chambers and the film-forming target S may be, between the first film-forming section 531 and the second film-forming section 531, exposed to the outside of the chamber 501.

The first terminal 502, the second terminal 503, the third terminal 504, the fourth terminal 505, the fifth terminal 506, the sixth terminal 507, the seventh terminal 508, and the eighth terminal 509 are each brought into contact with the film-forming target S. Here, in this embodiment, the film-forming target S is conveyed by the above-mentioned roll-to-roll mechanism, and thus the respective terminals need to be capable of being in stable contact with the film-forming target S which is moving.

Specifically, those terminals are made of an electrically conductive material such as carbon and various types of metal, and can have a circular arc shaped portion to be in contact with at least the film-forming target S. Further, those terminals can also be rolls made of an electrically conductive material as described above.

The respective terminals are arranged such that the film-forming target S comes into contact with the third terminal 504, the fourth terminal 505, the first terminal 502, the second terminal 503, the seventh terminal 508, the eighth terminal 509, the fifth terminal 506, and the sixth terminal 507 in the stated order from the side of the pay-out roll 517. Although the arrangement of the respective terminals is not particularly limited, as shown in FIG. 9, it is favorable to arrange them such that the film-forming target S between the third terminal 504 and the fourth terminal 505 and the film-forming target S between the first terminal 502 and the second terminal 503 are opposed to each other and the film-forming target S between the seventh terminal 508 and the eighth terminal 509 and the film-forming target S between the fifth terminal 506 and the sixth terminal 507 are opposed to each other.

The first power supply 510 applies voltage between the first terminal 502 and the second terminal 503 and the second power supply 511 applies voltage between the third terminal 504 and the fourth terminal 505. Further, the third power supply 512 applies voltage between the fifth terminal 506 and the sixth terminal 507 and the fourth power supply 513 applies voltage between the seventh terminal 508 and the eighth terminal. Those power supplies may be direct-current power supplies or may be alternating-current power supplies. Further, each power supply may be arranged inside the chamber 501 or may be arranged outside the chamber 501.

The crucible 514 is provided in the first film-forming section 531. The crucible 514 contains and heats the film-forming raw material to thereby generate gas of the film-forming raw material (hereinafter, raw material gas). The gas supply section 515 provided in the second film-forming section 532 and introduces the raw material gas into the chamber 501. The film-forming raw material is a reactive precursor or the like and only needs to react on the film-forming target S and form a thin film made of the film-forming material. It should be noted that the thin-film manufacturing apparatus 500 may have a configuration capable of supplying the first film-forming section 531 and the second film-forming section 532 with the film-forming raw material instead of the crucible 514 and the gas supply section 515.

The thin-film manufacturing apparatus 500 can have the above-mentioned configuration. In the thin-film manufacturing apparatus 500, the film-forming target S is heated by resistance heating, and a portion other than the film-forming target S does not reach excessively high temperature. Therefore, the thin-film manufacturing apparatus 500 can be made of a material selected irrespective of the thermal resistance.

[Regarding Thin-Film Manufacturing Method]

Figure 10:
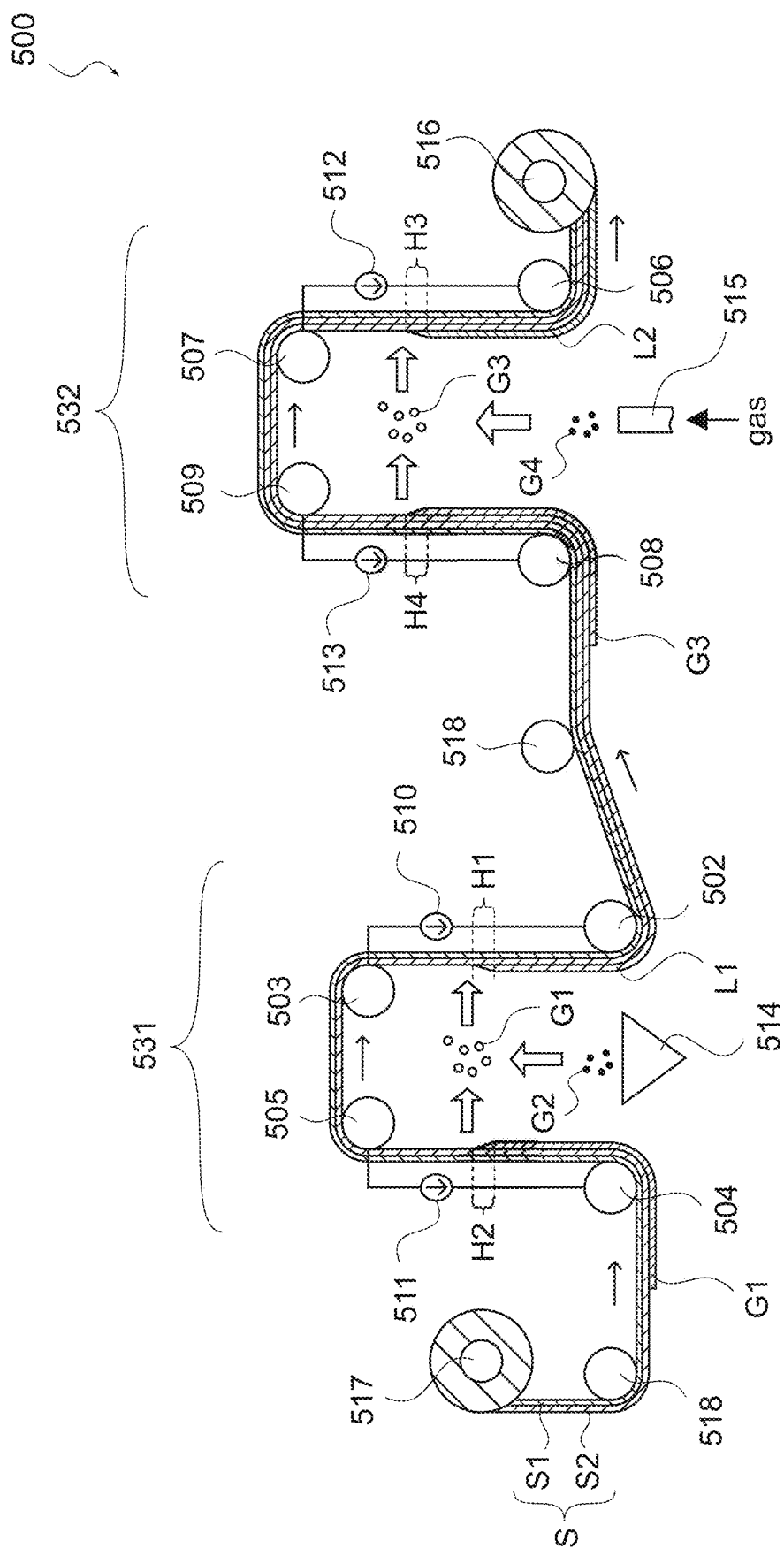
FIG. 10 A schematic view showing a thin-film manufacturing method using the thin-film manufacturing apparatus.

A manufacturing method for a thin film by utilizing the thin-film manufacturing apparatus 500 will be described. FIG. 10 is a schematic view showing a manufacturing method for a thin film, and illustration of the chamber 501 is omitted.

As shown in the figure, the roll of the film-forming target S is set on the pay-out roll 517, and one end of the film-forming target S is connected to the take-up roll 516. With this configuration, the film-forming target S comes into contact with the first terminal 502, the second terminal 503, the third terminal 504, the fourth terminal 505, the fifth terminal 506, the sixth terminal 507, the seventh terminal 508, and the eighth terminal 509.

The film-forming target S can be obtained by laminating the electrically conductive layer S2 on the metal foil S1. The metal foil S1 is, for example, copper foil and the electrically conductive layer S2 is, for example, graphene.

First of all, film-forming in the first film-forming section 531 will be described.

A film-forming raw material (hereinafter, a film-forming raw material G1) is made to adhere onto the electrically conductive layer S2 in advance. The film-forming raw material G1 may be liquid or solid and may be, for example, dispersion liquid obtained by dispersing powder in liquid. The film-forming raw material G1 can be made to adhere to the film-forming target S by any technique such as splaying, immersion, and screen coating.

After the chamber 501 is evacuated, the take-up roll 516 is rotated, and the film-forming target S is fed from the pay-out roll 517 to the take-up roll 516. At the same time, the first power supply 510 applies voltage between the first terminal 502 and the second terminal 503. By doing so, current flows between the first terminal 502 and the second terminal 503 via the film-forming target S, and the film-forming target S is heated (electrically heated) due to electrical resistance.

FIGS. 9 and 10 show a region (hereinafter, a heated region H1) of the film-forming target S, which reaches high temperature due to electrical heating between the first terminal 502 and the second terminal 503. As shown in those figures, the heated region H1 is relatively narrow, and is a region of approximately several cm in a direction in which the first terminal 502 and the second terminal 503 are opposed to each other. Therefore, the reaction space in which the thin film is formed has a volume of 10 $cm^3$ or less. It is favorable that the temperature of the heated region H1 is 300 K or more.

Further, the second power supply 511 applies voltage between the third terminal 504 and the fourth terminal 505. By doing so, current flows between the third terminal 504 and the fourth terminal 505 via the film-forming target S, and the film-forming target S is heated (electrically heated) due to electrical resistance.

FIGS. 9 and 10 show a region (hereinafter, a heated region H2) of the film-forming target S, which reaches high temperature due to electrical heating between the third terminal 504 and the fourth terminal 505. As shown in the figure, the heated region H2 is relatively narrow, and is a region of approximately several cm in a direction in which the third terminal 504 and the fourth terminal 505 are opposed to each other. It is favorable that the temperature of the heated region H2 is 300 K or more.

In addition, a film-forming raw material (hereinafter, a film-forming raw material G2) contained in the crucible 514 is heated and the film-forming raw material G2 is vaporized by the crucible 514. Further, the raw material gas may be introduced into the first film-forming section 531 by the gas supply section.

The film-forming raw material G1 is heated and vaporized in the heated region H2. The vaporized film-forming raw material G1 is mixed in the film-forming raw material G2 supplied from the crucible 514, and reaches the heated region H1. The mixture of the film-forming raw material G1 and the film-forming raw material G2 is changed in state due to heat of the heated region H1 and is deposited on the film-forming target S. In this manner, a thin film L1 is formed.

Any change in state of the film-forming raw material can be performed, and it only needs to enable a thin film to be formed on the film-forming target S. For example, chemical reaction, precipitation, crystallization, or crystal growth is performed. In this manner, the film-forming raw material G1 is supplied from the heated region H2 to the heated region H1. Therefore, it is favorable that the heated region H1 and the heated region H2 are in a positional relationship in which these are opposed to each other.

Further, the film-forming raw material G2 is mixed in the film-forming raw material G1 and is supplied to the heated region H1. Therefore, the crucible 514 is favorably positioned so as to supply the film-forming raw material G2 into a space between the heated region H1 and the heated region H2.

By performing electrical heating while conveying the film-forming target S by the roll-to-roll process, the heated region H2 is moved on the film-forming target S. Therefore, a point on the film-forming target S passes the heated region H2 for short time, and rapid heating and rapid cooling occur at the point on the film-forming target S.

Therefore, the film-forming raw material G1 is vaporized in the heated region H2 by a constant amount each time and the film-forming raw material G1 is supplied to the heated region H1 by a constant amount each time. With this configuration, a necessary amount of film-forming raw material G1, for example, an amount of film-forming raw material G1 that provides an ideal composition ratio for chemical reaction caused in the heated region H1 can be supplied to the heated region H1.

Further, by performing electrical heating while conveying the film-forming target S by the roll-to-roll process, the heated region H1 also moves on the film-forming target S. Therefore, a point on the film-forming target S passes the heated region H1 for short time, and rapid heating and rapid cooling occur at the point on the film-forming target S.

Time for which the point on the film-forming target S is heated, that is, the reaction time for which film-forming progresses can be controlled by using the conveyance speed of the film-forming target S. Specifically, by setting the conveyance speed of the film-forming target S to time for which a thin film having a desired number of layers is formed, it becomes possible to control the number of layers. The reaction time is favorably 10 minutes or less and the conveyance speed of the film-forming target S is favorably 10 m per minute or less.

In this manner, the thin film L1 is formed on the film-forming target S. The film-forming target S on which the thin film L1 is formed is conveyed to the second film-forming section 532 by the roll-to-roll process. Next, film-forming of the second film-forming section 532 will be described.

A film-forming raw material (hereinafter, a film-forming raw material G3) is made to adhere to the thin film L1 formed on the film-forming target S. The film-forming raw material G3 may be liquid or solid, and may be, for example, dispersion liquid obtained by dispersing powder in liquid. The film-forming raw material G3 can be made to adhere to the film-forming target S by any technique such as splaying, immersion, and screen coating.

While the film-forming target S is conveyed by the roll-to-roll process, the third power supply 512 applies voltage between the fifth terminal 506 and the sixth terminal 507. By doing so, current flows between the fifth terminal 506 and the sixth terminal 507 via the film-forming target S, and the film-forming target S is heated (electrically heated) due to electrical resistance.

FIGS. 9 and 10 show a region (hereinafter, a heated region H3) of the film-forming target S, which reaches high temperature due to electrical heating between the fifth terminal 506 and the sixth terminal 507. As shown in those figures, the heated region H3 is relatively narrow, and is a region of approximately several cm in a direction in which the fifth terminal 506 and the sixth terminal 507 are opposed to each other. Therefore, the reaction space in which the thin film is formed has a volume of 10 cm$^3$ or less.

Further, the fourth power supply 513 applies voltage between the seventh terminal 508 and the eighth terminal 509. By doing so, current flows between the seventh terminal 508 and the eighth terminal 509 via the film-forming target S, and the film-forming target S is heated (electrically heated) due to electrical resistance.

FIGS. 9 and 10 show a region (hereinafter, a heated region H4) of the film-forming target S, which reaches high temperature due to electrical heating between the seventh terminal 508 and the eighth terminal 509. As shown in the figure, the heated region H4 is relatively narrow, and the seventh terminal 508 and the eighth terminal 509 is a region of approximately several cm in a direction in which are opposed to each other. It is favorable that the temperature of the heated region H4 is 300 K or more.

In addition, the raw material gas is introduced into the second film-forming section 532 from the gas supply section 515 as a film-forming raw material (hereinafter, a film-forming raw material G4). The raw material gas can be introduced into the second film-forming section 532 at a constant flow rate. Alternatively, the solid or liquid film-forming raw material may be placed in the second film-forming section 532 and be vaporized in advance.

The film-forming raw material G3 is heated and vaporized in the heated region H4. The vaporized film-forming raw material G3 is mixed in the film-forming raw material G4 supplied from the gas supply section 515, and reaches the heated region H3. The mixture of the film-forming raw material G3 and the film-forming raw material G4 is changed in state due to heat of the heated region H3 and is deposited on the film-forming target S. In this manner, a thin film L2 is formed.

Any change in state of the film-forming raw material can be performed, and it only needs to enable a thin film to be formed on the thin film L1. For example, chemical reaction, precipitation, or crystallization is performed. In this manner, the film-forming raw material G3 is supplied from the heated region H4 to the heated region H3. Therefore, it is favorable that the heated region H3 and the heated region H4 are in a positional relationship in which these are opposed to each other.

Further, the film-forming raw material G4 is mixed in the film-forming raw material G3 and is supplied to the heated region H3. Therefore, the gas supply section 515 is favorably positioned so as to supply the film-forming raw material G4 into a space between the heated region H3 and the heated region H4.

By performing electrical heating while conveying the film-forming target S by the roll-to-roll process, the heated region H4 moves on the film-forming target S. Therefore, a point on the film-forming target S passes the heated region H4 for short time, and rapid heating and rapid cooling occur at the point on the film-forming target S.

Therefore, the film-forming raw material G3 is vaporized in the heated region H4 by a constant amount each time and the film-forming raw material G3 is supplied to the heated region H3 by a constant amount each time. With this configuration, a necessary amount of film-forming raw material G3, for example, an amount of film-forming raw material G3 that provides an ideal composition ratio for chemical reaction caused in the heated region H3 can be supplied to the heated region H3.

Further, by performing electrical heating while conveying the film-forming target S by the roll-to-roll process, the heated region H3 also moves on the film-forming target S. Therefore, a point on the film-forming target S passes the heated region H3 for short time, and rapid heating and rapid cooling occur at the point on the film-forming target S.

Time for which the point on the film-forming target S is heated, that is, the reaction time for which film-forming progresses can be controlled by using the conveyance speed of the film-forming target S. Specifically, in a case where the film-forming material is a material that grows in a layered form, by setting the conveyance speed of the film-forming target S to time for which a thin film having a desired number of layers is formed, it becomes possible to control the number of layers. The reaction time is favorably 10 minutes or less and the conveyance speed of the film-forming target S is favorably 10 m per minute or less.

It should be noted that after the thin film is formed on the film-forming target S, another thin film may be laminated on the thin film by performing electrical heating by inverting the roll-to-roll conveyance direction. Further, after a layer made of a particular film-forming material is formed, the film-forming raw material to be introduced into the chamber 501 can also be changed to thereby form a thin film in which a plurality of layers made of different kinds of film-forming materials are laminated on the film-forming target S.

In the above-mentioned manner, the thin film L1 made of the first film-forming material and the thin film L2 made of the second film-forming material are formed on the film-forming target S. It should be noted that although the thin-film manufacturing apparatus 500 includes the first film-forming section 531 and the second film-forming section 532, the thin-film manufacturing apparatus 500 may include three or more film-forming sections.

Application Example

A method of forming a thin film made of graphene, molybdenum disulfide, and hexagonal boron nitride (hBN) on the copper foil by utilizing the thin-film manufacturing apparatus 500 will be described.

Graphene formed as a film on the copper foil is, as the film-forming target S, set on the pay-out roll 517, and one end of the film-forming target S is connected to the take-up roll 516. The film-forming target S is brought into contact with the first terminal 502, the second terminal 503, the third terminal 504, the fourth terminal 505, the fifth terminal 506, the sixth terminal 507, the seventh terminal 508, and the eighth terminal 509.

The graphene may be formed as a film on the copper foil in advance or may be formed as a film in the chamber 501. In a case of performing film-forming in the chamber 501, the film-forming can be performed by heating the copper foil due to electrical heating and supplying carbon source gas. The carbon source gas is gas including carbon atoms such as carbon monoxide, methane, and ethane.

Molybdenum chloride (V) ($MoCl_5$) is applied to the electrically conductive layer S2 (graphene) as the film-forming raw material G1 in advance. Dispersion liquid obtained by dispersing powder of molybdenum chloride (V) can be applied to the film-forming target S by splaying, immersion, screen coating, or the like. This application may be performed in advance or may be performed in the chamber 501.

Voltage is applied between the first terminal 502 and the second terminal 503 and voltage is also applied between the third terminal 504 and the fourth terminal 505. Further, sulfur (S) is contained in the crucible 514 as the film-forming raw material G2 and heated to 450° C. or more. Under this state, the film-forming target S is conveyed by the roll-to-roll process.

The heated region H2 is formed due to electrical heating between the third terminal 504 and the fourth terminal 505, and molybdenum chloride (V) is sublimated in the heated region H2. It is favorable that the temperature of the heated region H2 is about 300° C.

Further, the sublimated sulfur is supplied from the crucible 514 and mixed in the molybdenum chloride (V). The mixture of the sulfur and the molybdenum chloride (V) reaches the heated region H1 formed due to electrical heating between the first terminal 502 and the second terminal 503, and molybdenum disulfide is formed. It is favorable that the temperature of the heated region H1 is about 850° C.

Molybdenum disulfide is precipitated on the film-forming target S and causes crystal growth. The heating range of the heated region H1 is about 2 cm, and it is rapidly cooled to the room temperature in a region in front of and behind that range. By controlling the roll-to-roll conveyance speed in cm/second and setting the reaction time of molybdenum disulfide in seconds, the total number of two-dimensional thin films of molybdenum disulfide can be controlled within a range of 1 to 10 layers or more. In this manner, the thin film L1 made of molybdenum disulfide is formed on the electrically conductive layer S2 made of graphene.

In addition, liquid organic metal trimethyl borate is applied to the thin film L1 as the film-forming raw material G3. The organic metal trimethyl borate can be applied to the graphene by splaying, immersion, screen coating, or the like.

Voltage is applied between the fifth terminal 506 and the sixth terminal 507 and voltage is also applied between the seventh terminal 508 and the eighth terminal 509. Further, nitrogen gas is introduced into the second film-forming section 532 from the gas supply section 515 as the film-forming raw material G4. Under this state, the film-forming target S is conveyed by the roll-to-roll process.

The heated region H4 is formed due to electrical heating between the seventh terminal 508 and the eighth terminal 509 and organic metal trimethyl borate is sublimated in the heated region H4. It is favorable that the temperature of the heated region H4 is about 80° C.

The nitrogen supplied from the gas supply section 515 and the organic metal trimethyl borate are mixed. This mixture reaches the heated region H3 formed due to electrical heating between the fifth terminal 506 and the sixth terminal 507 and hexagonal boron nitride is formed. It is favorable that the temperature of the heated region H3 is about 1800° C.

The hexagonal boron nitride is deposited on the thin film L1 made of molybdenum disulfide and causes crystal growth. In this manner, the thin film L2 is formed. The heating range of the heated region H1 is about 2 cm, and it is rapidly cooled to the room temperature in a region in front of and behind that range. By controlling the roll-to-roll conveyance speed in cm/second and setting the reaction time of hexagonal boron nitride in seconds, the total number of two-dimensional thin films of hexagonal boron nitride can be controlled within a range of 1 to 10 layers or more.

As described above, different kinds of laminated films made of graphene, molybdenum disulfide, and hexagonal boron nitride can be formed on the copper foil.

Application Example

The manufacturing method for a thin film according to each of the above-mentioned embodiments can be applied to a manufacturing method for various elements. Specifically, in each of elements such as a photoelectric conversion element having a thin film and including a photoelectric conversion film, a transparent electrode layer, and a charge storage circuit, a logic circuit having a thin film and including a transistor and a wiring electrode, a light-emitting element having a thin film and including a light-emitting layer, a buffer layer, a transparent electrode layer, and a thin-film transistor, and a light control element having a thin film and including a light control layer and a transparent electrode layer, the manufacturing method for a thin film according to each of the above-mentioned embodiments can be utilized at a step of manufacturing the thin film.

(Regarding Film-Forming Material)

A film-forming material that can be formed as a film by applying the present technology is not particularly limited. It is possible to favorably utilize the present technology for forming a two-dimensional thin film having a controlled number of layers, in particular, such as boron nitride, chalcogenide, black phosphorus, graphene, and silicene. Otherwise, the present technology is applicable to various film-forming materials that grow on Frank-van der Merwe (FM) growth mode or on Stranski-Krastanov growth mode.

(Regarding Effects of Present Technology)

Examples of effects of the present technology are shown below.

A layered compound having a controlled number of layers can be formed as a film.

A laminated compound having desired different kinds of materials forming heterojunction can be formed as a film.

Elements made of an element-forming two-dimensional material having a thin-film interface controlled can be mass-produced.

Degradation of a thin film due to interface junction can be suppressed.

A contact interface at which interface scattering is small can be obtained.

A two-dimensional thin-film element having a suitable film thickness for efficiently absorbing light can be obtained.

A three-dimensional thin-film element having a suitable interface for obtaining a tunnel transistor can be obtained.

A two-dimensional thin-film element capable of actively changing the optical properties can be obtained.

A two-dimensional thin-film element capable of actively changing the electrical properties can be obtained.

A two-dimensional thin-film element having high chemical stability can be obtained.

A two-dimensional thin-film element having high mechanical stability can be obtained.

A two-dimensional thin-film electrode having high transparency can be obtained.

A superlattice structure made of a two-dimensional thin film can be obtained.

A quantum confinement effect of a two-dimensional thin film can be provided.

It should be noted that the present technology may also take the following configurations.

(1)

A thin-film manufacturing method, including:

bringing an electrically conductive film-forming target into contact with a first terminal and a second terminal;

heating a first region that is a region of the film-forming target between the first terminal and the second terminal by applying voltage between the first terminal and the second terminal; and forming a thin film in the first region by controlling reaction time such that a thin film having a desired number of layers is formed.

(2)

The thin-film manufacturing method according to (1), in which the thin film is a laminated film in which different kinds of materials are laminated.

(3)

The thin-film manufacturing method according to (1) or (2), further including applying voltage between the first terminal and the second terminal and controlling the reaction time by using movement speed of the film-forming target while moving the film-forming target with respect to the first terminal and the second terminal.

(4)

The thin-film manufacturing method according to (3), further including conveying the film-forming target by a roll-to-roll process and moving the film-forming target with respect to the first terminal and the second terminal.

(5)

The thin-film manufacturing method according to any one of (1) to (4), further including controlling the reaction time by using application time of voltage on the first terminal and the second terminal.

(6)

The thin-film manufacturing method according to (5), further including:

stopping voltage application between the first terminal and the second terminal;

cooling the first region; and controlling the reaction time such that a thin film having a desired number of layers is formed.

(7)

The thin-film manufacturing method according to any one of (1) to (6), further including:

further bringing the film-forming target into contact with a third terminal and a fourth terminal;

heating a second region that is a region of the film-forming target between the third terminal and the fourth terminal by applying voltage between the third terminal and the fourth terminal;

vaporizing, in the second region, a film-forming raw material made to adhere to the film-forming target; and supplying the vaporized film-forming raw material to the first region.

(8)

The thin-film manufacturing method according to (7), further including further bringing the film-forming target into contact with a fifth terminal and a sixth terminal;

heating a third region that is a region of the film-forming target between the fifth terminal and the sixth terminal by applying voltage between the fifth terminal and the sixth terminal;

supplying a film-forming raw material to the third region; and laminating a thin film in the third region by controlling reaction time.

(9)

The thin-film manufacturing method according to (8), further including further bringing the film-forming target into contact with a seventh terminal and an eighth terminal;

heating a fourth region that is a region of the film-forming target between the seventh terminal and the eighth terminal by applying voltage between the seventh terminal and the eighth terminal;

vaporizing, in the fourth region, a film-forming raw material made to adhere to the film-forming target; and supplying the vaporized film-forming raw material to the third region.

(10)

The thin-film manufacturing method according to any one of (1) to (9), in which the reaction time is 10 minutes or less.

(11)

The thin-film manufacturing method according to (3), in which the film-forming target is moved at such speed that the reaction time becomes 10 minutes or less.

(12)

The thin-film manufacturing method according to (3), in which the film-forming target is moved at a speed of 10 m per minute or less.

(13)

The thin-film manufacturing method according to any one of (1) to (12), in which the first region is heated at a temperature of 300 K or more.

(14)

A thin-film manufacturing apparatus, including:

a first terminal;

a second terminal;

a first power supply that applies voltage between the first terminal and the second terminal;

a third terminal;

a fourth terminal;

a second power supply that applies voltage between the third terminal and the fourth terminal; and a conveying mechanism that conveys a film-forming target while bringing the film-forming target into contact with the first terminal, the second terminal, the third terminal, and the fourth terminal, in which the first terminal, the second terminal, the third terminal, and the fourth terminal are provided such that a first region that is a region of the film-forming target between the first terminal and the second terminal is opposed to a second region that is a region of the film-forming target between the third terminal and the fourth terminal.

(15)

The thin-film manufacturing apparatus according to (14), further including:

a fifth terminal;

a sixth terminal;

a third power supply that applies voltage between the fifth terminal and the sixth terminal;

a seventh terminal;

an eighth terminal;

a fourth power supply that applies voltage between the seventh terminal and the eighth terminal, in which the conveying mechanism conveys the film-forming target while bringing the film-forming target into contact with the first terminal, the second terminal, the third terminal, the fourth terminal, the fifth terminal, the sixth terminal, the seventh terminal, and the eighth terminal, and the fifth terminal, the sixth terminal, the seventh terminal, and the eighth terminal are provided such that a third region that is a region of the film-forming target between the fifth terminal and the sixth terminal is opposed to a fourth region that is a region of the film-forming target between the seventh terminal and the eighth terminal.

(16)

The thin-film manufacturing apparatus according to (15), further including a chamber that houses the first terminal, the second terminal, the third terminal, the fourth terminal, the fifth terminal, the sixth terminal, the seventh terminal, and the eighth terminal.

(17)

A manufacturing method for a photoelectric conversion element having a thin film and including a photoelectric conversion film, a transparent electrode layer, and a charge storage circuit, including, as a step of manufacturing the thin film, steps of:

bringing an electrically conductive film-forming target into contact with a first terminal and a second terminal;

heating a first region that is a region of the film-forming target between the first terminal and the second terminal by applying voltage between the first terminal and the second terminal;

supplying a film-forming raw material to the first region; and forming a thin film in the first region by controlling reaction time such that a thin film having a desired number of layers is formed.

(18)

A manufacturing method for a logic circuit having a thin film and including a transistor and a wiring electrode, including, as a step of manufacturing the thin film, steps of:

bringing an electrically conductive film-forming target into contact with a first terminal and a second terminal;

heating a first region that is a region of the film-forming target between the first terminal and the second terminal by applying voltage between the first terminal and the second terminal; and supplying a film-forming raw material to the first region; and forming a thin film in the first region by controlling reaction time such that a thin film having a desired number of layers is formed.

(19)

A manufacturing method for a light-emitting element having a thin film and including a light-emitting layer, a buffer layer, a transparent electrode layer, and a thin-film transistor, including, as a step of manufacturing the thin film, steps of:

bringing an electrically conductive film-forming target into contact with a first terminal and a second terminal;

heating a first region that is a region of the film-forming target between the first terminal and the second terminal by applying voltage between the first terminal and the second terminal;

supplying a film-forming raw material to the first region; and forming a thin film in the first region by controlling reaction time such that a thin film having a desired number of layers is formed.

(20)

A manufacturing method for a light control element having a thin film and including a light control layer and a transparent electrode layer, including, as a step of manufacturing the thin film, steps of:

bringing an electrically conductive film-forming target into contact with a first terminal and a second terminal;

heating a first region that is a region of the film-forming target between the first terminal and the second terminal by applying voltage between the first terminal and the second terminal;

supplying a film-forming raw material to the first region; and forming a thin film in the first region by controlling reaction time such that a thin film having a desired number of layers is formed.

REFERENCE SIGNS LIST 100, 200, 300, 400, 500 thin-film manufacturing apparatus
101, 201, 301, 401, 501 chamber
102, 202, 302, 402, 502 first terminal
103, 203, 303, 403, 503 second terminal
404, 504 third terminal
405, 505 fourth terminal
506 fifth terminal
507 sixth terminal
508 seventh terminal
509 eighth terminal

The invention claimed is:

1. A thin-film manufacturing method, comprising:
bringing an electrically conductive film-forming target into contact with a first terminal and a second terminal;
heating a first region that is a region of the film-forming target between the first terminal and the second terminal by applying voltage between the first terminal and the second terminal;
supplying a film-forming raw material to the first region; and
forming a thin film in the first region by controlling reaction time such that a thin film having a desired number of layers is formed.

2. The thin-film manufacturing method according to claim 1, wherein
the thin film is a laminated film in which different kinds of materials are laminated.

3. The thin-film manufacturing method according to claim 1, further comprising
applying voltage between the first terminal and the second terminal and controlling the reaction time by using movement speed of the film-forming target while moving the film-forming target with respect to the first terminal and the second terminal.

4. The thin-film manufacturing method according to claim 3, further comprising
conveying the film-forming target by a roll-to-roll process and moving the film-forming target with respect to the first terminal and the second terminal.

5. The thin-film manufacturing method according to claim 1, further comprising
controlling the reaction time by using application time of voltage on the first terminal and the second terminal.

6. The thin-film manufacturing method according to claim 5, further comprising:
stopping voltage application between the first terminal and the second terminal;
cooling the first region; and
controlling the reaction time such that a thin film having a desired number of layers is formed.

7. The thin-film manufacturing method according to claim 1, further comprising:
further bringing the film-forming target into contact with a third terminal and a fourth terminal;
heating a second region that is a region of the film-forming target between the third terminal and the fourth terminal by applying voltage between the third terminal and the fourth terminal;
vaporizing, in the second region, a film-forming raw material made to adhere to the film-forming target; and
supplying the vaporized film-forming raw material to the first region.

8. The thin-film manufacturing method according to claim 7, further comprising
further bringing the film-forming target into contact with a fifth terminal and a sixth terminal;
heating a third region that is a region of the film-forming target between the fifth terminal and the sixth terminal by applying voltage between the fifth terminal and the sixth terminal;
supplying a film-forming raw material to the third region; and
laminating a thin film in the third region by controlling reaction time.

9. The thin-film manufacturing method according to claim 8, further comprising
further bringing the film-forming target into contact with a seventh terminal and an eighth terminal;
heating a fourth region that is a region of the film-forming target between the seventh terminal and the eighth terminal by applying voltage between the seventh terminal and the eighth terminal;
vaporizing, in the fourth region, a film-forming raw material made to adhere to the film-forming target; and
supplying the vaporized film-forming raw material to the third region.

10. The thin-film manufacturing method according to claim 1, wherein
the reaction time is 10 minutes or less.

11. The thin-film manufacturing method according to claim 3, wherein
the film-forming target is moved at such speed that the reaction time becomes 10 minutes or less.

12. The thin-film manufacturing method according to claim 3, wherein
the film-forming target is moved at a speed of 10 m per minute or less.

13. The thin-film manufacturing method according to claim 1, wherein
the first region is heated at a temperature of 300 K or more.

14. A manufacturing method for a photoelectric conversion element having a thin film and including a photoelectric conversion film, a transparent electrode layer, and a charge storage circuit, comprising, as a step of manufacturing the thin film, steps of:
bringing an electrically conductive film-forming target into contact with a first terminal and a second terminal;
heating a first region that is a region of the film-forming target between the first terminal and the second terminal by applying voltage between the first terminal and the second terminal;
supplying a film-forming raw material to the first region; and
forming a thin film in the first region by controlling reaction time such that a thin film having a desired number of layers is formed.

15. A manufacturing method for a logic circuit having a thin film and including a transistor and a wiring electrode, comprising, as a step of manufacturing the thin film, steps of:
bringing an electrically conductive film-forming target into contact with a first terminal and a second terminal;
heating a first region that is a region of the film-forming target between the first terminal and the second terminal by applying voltage between the first terminal and the second terminal; and
supplying a film-forming raw material to the first region; and
forming a thin film in the first region by controlling reaction time such that a thin film having a desired number of layers is formed.

16. A manufacturing method for a light-emitting element having a thin film and including a light-emitting layer, a buffer layer, a transparent electrode layer, and a thin-film transistor, comprising, as a step of manufacturing the thin film, steps of:
bringing an electrically conductive film-forming target into contact with a first terminal and a second terminal;
heating a first region that is a region of the film-forming target between the first terminal and the second terminal by applying voltage between the first terminal and the second terminal;
supplying a film-forming raw material to the first region; and
forming a thin film in the first region by controlling reaction time such that a thin film having a desired number of layers is formed.

17. A manufacturing method for a light control element having a thin film and including a light control layer and a transparent electrode layer, comprising, as a step of manufacturing the thin film, steps of:
bringing an electrically conductive film-forming target into contact with a first terminal and a second terminal;
heating a first region that is a region of the film-forming target between the first terminal and the second terminal by applying voltage between the first terminal and the second terminal;
supplying a film-forming raw material to the first region; and
forming a thin film in the first region by controlling reaction time such that a thin film having a desired number of layers is formed.

* * * * *